(12) United States Patent
Huang et al.

(10) Patent No.: US 10,818,781 B2
(45) Date of Patent: Oct. 27, 2020

(54) HETEROJUNCTION BIPOLAR TRANSISTOR STRUCTURE WITH A BANDGAP GRADED HOLE BARRIER LAYER

(71) Applicant: VISUAL PHOTONICS EPITAXY CO., LTD., Taoyuan (TW)

(72) Inventors: Chao-Hsing Huang, Taoyuan (TW); Yu-Chung Chin, Taoyuan (TW); Min-Nan Tseng, New Taipei (TW); Kai-Yu Chen, Taoyuan (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 0 days.

(21) Appl. No.: 16/796,018

(22) Filed: Feb. 20, 2020

(65) Prior Publication Data

US 2020/0194573 A1    Jun. 18, 2020

Related U.S. Application Data

(63) Continuation-in-part of application No. 16/161,185, filed on Oct. 16, 2018, now Pat. No. 10,651,298.

(51) Int. Cl.
*H01L 29/737* (2006.01)
*H01L 29/08* (2006.01)
*H01L 29/205* (2006.01)
*H01L 29/10* (2006.01)

(52) U.S. Cl.
CPC ...... *H01L 29/7373* (2013.01); *H01L 29/0817* (2013.01); *H01L 29/0826* (2013.01); *H01L 29/1004* (2013.01); *H01L 29/205* (2013.01)

(58) Field of Classification Search
CPC ... H01L 29/36; H01L 29/778; H01L 29/0821; H01L 29/205; H01L 29/1004; H01L 29/0817
See application file for complete search history.

(56) References Cited

U.S. PATENT DOCUMENTS

| 5,631,477 A * | 5/1997 | Streit | H01L 29/7371 257/197 |
| 6,355,947 B1 * | 3/2002 | Niwa | H01L 29/0817 257/197 |
| 2005/0139863 A1 * | 6/2005 | Welser | H01L 29/7371 257/197 |

(Continued)

*Primary Examiner* — Kyoung Lee
*Assistant Examiner* — Christina A Sylvia
(74) *Attorney, Agent, or Firm* — Lin & Associates Intellectual Property, Inc.

(57) ABSTRACT

Provided is a heterojunction bipolar transistor (HBT) structure with a bandgap graded hole barrier layer, including: a sub-collector layer including an N-type group III-V semiconductor on a substrate, a collector layer on the sub-collector layer and including a group III-V semiconductor, a hole barrier layer on the collector layer, a base layer on the hole barrier layer and including a P-type group III-V semiconductor, an emitter layer on the base layer and including an N-type group III-V semiconductor, an emitter cap layer on the emitter layer and including an N-type group III-V semiconductor, and an ohmic contact layer on the emitter cap layer and including an N-type group III-V semiconductor. Bandgaps of the hole barrier layer at least include a gradually increasing bandgap from the base layer towards the collector layer and a largest bandgap of the hole barrier layer is greater than bandgap of the base layer.

20 Claims, 16 Drawing Sheets

(56) References Cited

U.S. PATENT DOCUMENTS

2007/0023783 A1* 2/2007 Hase .................. H01L 29/7371
    257/197
2019/0115458 A1* 4/2019 Chin .................. H01L 29/0821

* cited by examiner

HETEROJUNCTION BIPOLAR TRANSISTOR STRUCTURE WITH A BANDGAP GRADED HOLE BARRIER LAYER

CROSS-REFERENCE TO RELATED APPLICATION

This application is a continuation-in-part of U.S. patent application Ser. No. 16/161,185, filed on Oct. 16, 2018, entitled "HETEROJUNCTION BIPLOAR TRANSISITOR STRUCTURE WITH A BANDGAP GRADED HOLE BARRIER LAYER," the benefits of the filing date of which is hereby claimed and the specification of which is incorporated herein by this reference.

BACKGROUND OF THE INVENTION

1. Field of the Invention

The present disclosure relates to a heterojunction bipolar transistor (HBT) structure with a bandgap graded hole barrier layer, and in particular to adding a hole barrier layer to the base and collector junction of an HBT structure, wherein the bandgaps of the hole barrier layer at least comprise a gradually increasing bandgap from the base layer towards the collector layer.

2. The Prior Arts

Generally, a heterojunction bipolar transistor (HBT) is a specific transistor having an emitter and a base formed by different semiconductor materials. Accordingly, a heterojunction is formed between the emitter and the base. One advantage of an HBT (such as an NPN HBT) is that the emitter injection efficiency is greatly increased because it is difficult for the hole current to flow through the valence band barrier ($\Delta Ev$) between the base and the emitter. The current gain is thus further enhanced under the higher base dopant concentration. The efficiency of power amplifiers is an important factor when HBTs are used in power amplifiers of hand-held devices. It should be noted that the key factors of an HBT are the knee voltage and the turn-on voltage. Therefore, one of the important issues is how to effectively decrease the knee voltage and the turn-on voltage of an HBT. In addition, increasing the operating voltage or current of the power amplifier through the circuit design can improve the power added efficiency (PAE). However, when the HBT is operated at a high voltage, a high current, or a high power mode, the knee voltage will also be increased which will offset the PAE. Hence, how to effectively reduce the knee voltage of the HBT under high power operation is a very important topic.

Taiwan Patent No. 1562358 discloses a HBT structure formed directly or indirectly on a GaAs substrate that is formed by a (100) face towards a (111)B face (i.e., (1-11) or (11-1)). The directed epitaxial HBT of the present invention includes a sub-collector layer, a collector layer, a tunnel collector layer, a base layer, an emitter layer, an emitter cap layer and an ohmic contact layer, which are sequentially formed on the GaAs substrate.

The above patent is a III-V semiconductor HBT formed directly or indirectly on a (100) toward (111) B-orientation GaAs substrate. Specifically, the tunnel collector layer is formed by InGaP or InGaAsP, and the emitter layer is formed by N-type group III-V semiconductors having a bandgap larger than that of the base layer. Since an epitaxial process is performed on the substrate from a (100) face towards a (111)B face, indium and gallium contained in InGaP or InGaAsP are affected by the ordering effect such that InGaP or InGaAsP used in the emitter layer and/or the tunnel collector layer has a higher electron affinity or a smaller bandgap. Accordingly, the conduction band discontinuity between a base-emitter junction and/or a base-tunnel collector junction is decreased so as to lower the turn-on voltage and the offset voltage (VOS) of the HBT, thereby improving the collector current blocking effect, decreasing the knee voltage (VKNEE), greatly increasing the PAE for the HBT power amplifier (PA) and enhancing the overall electrical characteristics of PA.

However, due to an excessively large valence band discontinuity ($\Delta Ev$) at the junction of the InGaP or InGaAsP tunneling collector layer and the base layer, when HBT operates at a high current density or a high power, there are too many holes blocking at base-tunnel collector junction and it causes the junction electric field to change and adversely affect the knee voltage characteristics, which results in the limitation of the PAE at a high current density or a high power. Also, at the junction of InGaP or InGaAsP tunneling collector layer and collector layer, due to excessively large valence band discontinuities, an excessively deep quantum well is easily formed, which causes the holes to accumulate in the quantum well, causing unpredictable electric field changes. In addition, the accumulated hole charge will affect the charging and discharging time of HBT, which will affect the RF performance of PA. Besides, the base layer and the collector layer are usually mainly made of an arsenic-containing only group III-V material, and the tunneling collector layer made of InGaP or InGaAsP with high phosphorus content. As the gas switches from arsenic to phosphorus or from phosphorus to arsenic in epitaxial growth, the intermixing is easy to occur and form an unexpected arsenic and phosphorus compound layer. This arsenic and phosphorus compound layer will make the etching process of the HBT difficult, resulting in lower process yield. In addition, because the InGaP or InGaAsP has a high phosphorus content, when growing bandgap graded epitaxy at the junction with the base or the collector made of an arsenic-containing mainly group III-V material, it is easy to form arsenic-phosphorus intermixing to cause difficulty in controlling the material composition of bandgap graded structure and results in difficulty to achieve the originally designed bandgap graded junctions profile, or even results in difficulty to reproduce the bandgap graded profile. In addition, even the epitaxial growth of InGaP or InGaAsP tunneling collector layer on the (100) toward (111)B-orientation GaAs substrate can reduce the conduction band discontinuities between the base layer and the tunneling collector layer or between the tunneling collector layer and the collector layer, the electron barrier is still difficult to be completely eliminated, which causes the collector current blocking effect when the HBT device is operated at a high current density or a high power, and limits the PAE improvement.

Therefore, it is desirable to have an HBT structure with a bandgap graded hole barrier layer that is easy to implement the bandgap graded epitaxial growth technology. In addition to effectively eliminating the electron barrier of the conduction band at the junction of the hole barrier layer and the base layer or the collector layer, it maintains the sufficient hole barrier height to improve the collector current blocking effect in high current density operation, reduce the knee voltage, and increase the PAE. Reducing the depth or eliminating the hole quantum well between the hole barrier layer and the collector layer can reduce or avoid the accumulation of the hole charge, improving the overall HBT electrical characteristics, especially operated at high power mode. The PA saturation power is not suppressed at high power operation.

SUMMARY OF THE INVENTION

A heterojunction bipolar transistor (HBT) structure with a bandgap graded hole barrier layer is disclosed, comprising: a substrate; a sub-collector layer comprising an N-type group III-V semiconductor on the substrate; a collector layer on the sub-collector layer, comprising a group III-V semiconductor; a hole barrier layer on the collector layer; a base layer on the hole barrier layer, comprising a P-type group III-V semiconductor; an emitter layer on the base layer, comprising an N-type group III-V semiconductor; an emitter cap layer on the emitter layer, comprising an N-type group III-V semiconductor; an ohmic contact layer on the emitter cap layer, comprising an N-type group III-V semiconductor; wherein bandgaps of the hole bather layer at least comprise a gradually increasing bandgap from the base layer towards the collector layer and a largest bandgap of the hole barrier layer is greater than bandgap of the base layer.

According to an embodiment of the present invention, the hole barrier layer comprises a material selected from the group consisting of: GaAs, GaAsSb, GaAsPSb, InGaAs, InGaAsN, $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$ and $In_rAl_xGa_{1-x-r}As$, wherein $0<x<1$.

According to an embodiment of the present invention, the hole barrier layer comprises a material selected from the group consisting of: GaAs, GaAsSb, GaAsPSb, InGaAs, InGaAsN, $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$ and $In_rAl_xGa_{1-x-r}As$, wherein the largest value of x is ranged from 0.03 to 0.8.

According to an embodiment of the present invention, the hole barrier layer comprises a material selected from the group consisting of: GaAs, GaAsSb, GaAsPSb, InGaAs, InGaAsN, $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$ and $In_rAl_xGa_{1-x-r}As$, wherein the largest value of x is ranged from 0.05 to 0.22, and y, z, r, $w \le 0.1$.

According to an embodiment of the present invention, the thickness of the hole bather layer is between 1 nm-500 nm.

According to an embodiment of the present invention, the collector layer comprises a material selected from the group consisting of: GaAs, InGaP, InGaAsP and AlGaAs; the base layer comprises a P-type material selected from the group consisting of: GaAs, GaAsSb, GaAsPSb, InGaAs, and InGaAsN; the emitter layer comprises a N-type material selected from the group consisting of: AlGaAs, InGaP, InAlGaP and InGaAsP.

According to an embodiment of the present invention, the emitter cap layer comprises a N-type material selected from the group consisting of: GaAs, AlGaAs, InGaP, and InGaAsP; and the ohmic contact layer comprises a N-type material selected from the group consisting of: GaAs and InGaAs.

According to an embodiment of the present invention, the heterojunction bipolar transistor structure further includes an intermediate composite layer, the intermediate composite layer includes a semiconductor layer provided between the substrate and the sub-collector layer.

According to an embodiment of the present invention, the hole barrier layer further includes a wide bandgap layer, and the wide bandgap layer provides a valence band discontinuity between the wide bandgap layer and its adjacent epitaxial layer.

According to an embodiment of the present invention, the wide bandgap layer comprises a material selected from the group consisting of: AlGaAs, AlGaAsP, AlGaAsN, AlGaAsSb, AlGaAsBi, InGaP, InGaPN, InGaPSb, InGaPBi, InGaAsP, InGaAsPN, InGaAsPSb, InGaAsPBi, InAlGaP, InAlGaPN, InAlGaPSb and InAlGaPBi.

According to an embodiment of the present invention, the thickness of the wide bandgap layer is equal to or less than 50 nm, wherein 0 is excluded.

The foregoing will become better understood from a careful reading of a detailed description provided herein below with appropriate reference to the accompanying drawings.

BRIEF DESCRIPTION OF THE DRAWINGS

The present invention will be apparent to those skilled in the art by reading the following detailed description of a preferred embodiment thereof, with reference to the attached drawings, in which:

FIG. 11a illustrates a wide bandgap layer further formed in the embodiment of FIG. 4a;

FIG. 12a illustrates a wide bandgap layer further formed in the embodiment of FIG. 3a;

FIG. 13a illustrates a wide bandgap layer further formed in the embodiment of FIG. 4a;

FIG. 14a illustrates a wide bandgap layer further formed in the embodiment of FIG. 4a;

FIG. 15a illustrates a wide bandgap layer further formed in the embodiment of FIG. 6a.

DETAILED DESCRIPTION OF THE PREFERRED EMBODIMENT

Figure 1:
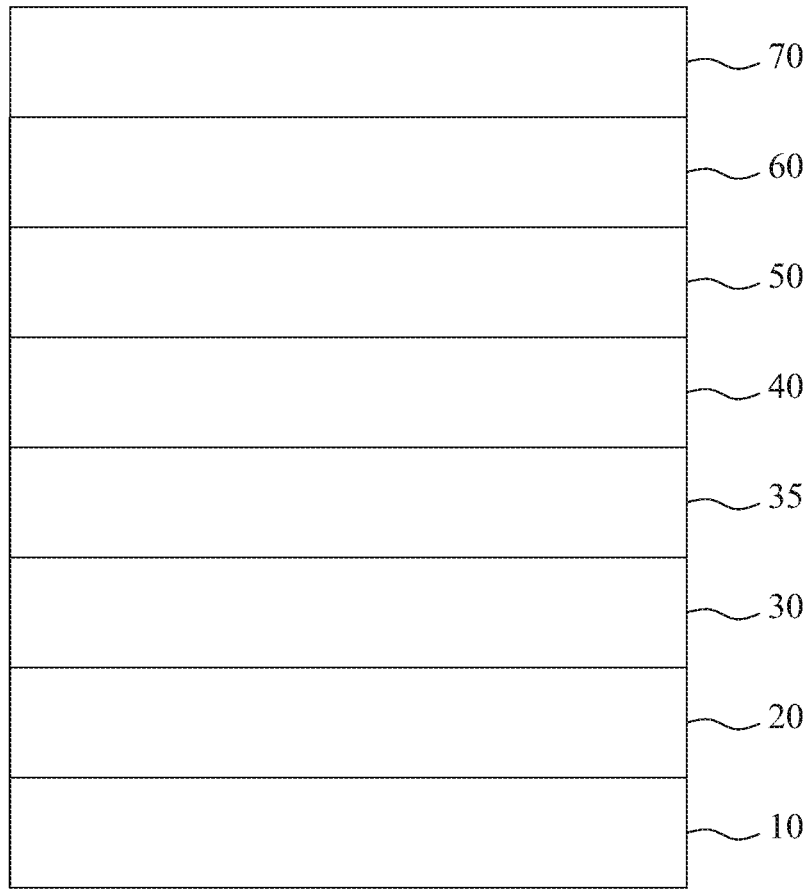
FIG. 1 shows a schematic view of a heterojunction bipolar transistor structure with a bandgap graded hole barrier layer in accordance with the first exemplary embodiment of the present invention.

The present invention may be embodied in various forms, and the details of the preferred embodiments of the present invention will be described in the subsequent contents with reference to the accompanying drawings. The drawings (not to scale) show and depict only the preferred embodiments of the present invention, and will not be considered as limitations to the scope of the present invention. Modifications of the present invention should be considered within the spirit of the present invention.

Examples of specific elements and arrangements thereof are described below to simplify the present invention. These are, of course, merely examples and they are not intended to limit the scope of the present disclosure. In the present disclosure, for example, when a first epitaxial layer formed above or on a second epitaxial layer, it may include an exemplary embodiment in which the first epitaxial layer is in direct contact with the second epitaxial layer, or it may include an exemplary embodiment in which other elements or epitaxial layers are formed between thereof, such that the first epitaxial layer is not in direct contact with the second epitaxial layer. In addition, repeated reference numerals and/or notations may be used in different embodiments, these repetitions are only used to describe some embodiments simply and clearly, and do not represent a specific relationship between the different embodiments and/or structures discussed.

Further, spatially relative terms, such as "on," "lower," "above," "therein," and the like, may be used herein for ease of description to describe one element or feature's relationship to another element(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "comprising", "having", "with", "wherein" or the foregoing transformations used herein, these terms are similar to the terms "comprising" to include corresponding features.

In addition, a "layer" may be a single layer or a plurality of layers; and "a portion" of an epitaxial layer may be one layer of the epitaxial layer or a plurality of adjacent layers.

FIG. 1 shows a schematic view of a heterojunction bipolar transistor (HBT) structure with a bandgap graded hole barrier layer in accordance with the first exemplary embodiment of the present invention. As shown in FIG. 1, the HBT structure with a bandgap graded hole barrier layer of a first embodiment of the present invention comprises: a sub-collector layer 20, a collector layer 30, a hole barrier layer 35, a base layer 40, an emitter layer 50, an emitter cap layer 60, and an ohmic contact layer 70, all formed sequentially on a substrate 10 from bottom up; wherein the sub-collector layer 20 comprises an N-type group III-V semiconductor and formed on the substrate 10; the collector layer 30 is formed on the sub-collector layer 20 and comprises an N-type group III-V semiconductor; the hole barrier layer 35 is formed on the collector layer 30; the thickness of the hole barrier layer 35 is between 1 nm-500 nm; the hole barrier layer 35 can be P-type, undoped, or N-type; preferably, the hole barrier layer 35 is undoped or N-type, and optimally, the hole barrier layer 35 is N-type, with a doping concentration greater than $1 \times 10^{15}/cm^3$, preferably between $1 \times 10^{15}/cm^3$ and $1 \times 10^{19}/cm^3$, and optimally between $1 \times 10^{16}/cm^3$ and $5 \times 10^{18}/cm^3$; the base layer 40 is formed on the hole barrier layer 35 and comprises a P-type group III-V semiconductor; the emitter layer 50 is formed on the base layer 40 and comprises an N-type group III-V semiconductor having a bandgap larger than that of the base layer 40; the emitter cap layer 60 is formed on the emitter layer 50 and comprises an N-type group III-V semiconductor; and the ohmic contact layer 70 is formed on the emitter cap layer 60 and comprises an N-type group III-V semiconductor; wherein bandgaps of the hole barrier layer 35 at least comprise a gradually increasing bandgap from the base layer 40 towards the collector layer 30 and a largest bandgap of the hole barrier layer is greater than the bandgap of the base layer.

The hole barrier layer comprises a material selected from the group consisting of: GaAs, GaAsSb, GaAsPSb, InGaAs, InGaAsN, $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$, and $In_rAl_xGa_{1-x-r}As$, wherein 0<x<1; or the largest value of x is ranged from 0.03 to 0.8; or the largest value of x is ranged from 0.05 to 0.22, and y, z, r, w≤0.1.

Further, the material composition in a semiconductor layer is described. Taking $Al_{0.03}Ga_{0.97}As_{0.9}P_{0.1}$ as an example ($Al_xGa_{1-x}As_{1-z}P_z$, x=0.03 and z=0.1), it indicates that the total number of moles of group III (Al and Ga) is equal to total number of moles of group V (As and P), the moles fraction between the elements is Al:Ga:As:P=0.03:0.97:0.9:0.1. Regarding the Al composition of the hole barrier layer, the largest value of x is between 0.03 and 0.8 (0.03≤x≤0.8) means that the Al composition of the hole barrier layer can be varied from a certain value to its largest (maximum) value or from its largest (maximum) value to a certain value. The Al composition can even be varied from zero or to zero. However, as long as the Al composition therein is the highest, the largest value of x should be between 0.03 and 0.8 (0.03≤x≤0.8).

The bandgap of the collector layer 30 nearby the junction of the hole barrier layer 35 and the collector layer 30 may be approximately equal to or smaller than the largest bandgap of the hole barrier layer 35. It should be noted that the bandgap of the collector layer 30 just mentioned above is only for the bandgap at the junction of the hole barrier layer 35 and the collector layer 30, bandgaps of other parts of the collector layer 30 can be varied.

The largest bandgap of the hole barrier layer is greater than bandgap of the base layer, the bandgap of the base layer 40 just mentioned above is only for the base bandgap at the junction of the hole barrier layer 35 and the base layer 40.

In one embodiment, the sub-collector layer 20 comprises a N-type material selected from the group consisting of: GaAs, AlGaAs, InGaP and InGaAsP; the collector layer 30 comprises a material selected from the group consisting of: GaAs, InGaP, InGaAsP and AlGaAs; some semiconductor layers mentioned herein, such as the collector layer 30, may be P-type, N-type or undoped; preferably, at least a portion of the collector layer 30 is N-type; the base layer 40 comprises a P-type material selected from the group consisting of: GaAs, GaAsSb, GaAsPSb, InGaAs and InGaAsN. The emitter layer comprises a N-type material selected from the group consisting of: AlGaAs, InGaP, InGaAsP and InAlGaP. The emitter cap layer 60 comprises a N-type material selected from the group consisting of: GaAs, AlGaAs, InGaP and InGaAsP. The ohmic contact layer 70 comprises a N-type material selected from the group consisting of: GaAs and InGaAs.

Because the hole barrier layer 35 comprises the graded bandgap, some embodiments of the present invention can eliminate or reduce the conduction band electron barrier of the junction of the hole barrier layer 35 and the base layer 40. Therefore, the substrate 10 is not limited to a certain tilt orientation (e.g., tilted from the (100) face toward the (111)B-face), the hole barrier layer 35 is not limited to the use of the InGaP or InGaAsP epitaxial layer material. By selecting the compositions of the hole barrier layer 35 and composition graded, one aspect of this invention can maintain a sufficient hole barrier height at the junction of the hole barrier layer 35 and the base layer 40, and to reduce the depth of the valence band quantum well or eliminate the valence band quantum well at the junction between the hole barrier layer 35 and the collector layer 30, thereby further improving the PAE, linearity or RF performance of PA in high current density or in high power operation without suppression on the output saturation power.

Since the largest bandgap of the hole barrier layer is greater than bandgap of the base layer, in such way the saturation current and the diffusion capacitance of base-collector junction can be reduced, and also the base-collector voltage dependence of the base-collector capacitance in or near the saturation region is smaller in the HBT of the embodiment compared with the prior art HBT, so that the collector current density Jc dependence of the cut off frequency ft is smaller in the HBT of the embodiment compared with the prior art HBT while the HBT is operating in or near the saturation region. Consequently, the linearity of HBT of the embodiment is improved.

Moreover, a spacer layer (not shown) is further provided between the hole barrier layer and the base layer and/or between the hole barrier layer and the collector layer, and the spacer layer comprises a group III-V semiconductor. In other words, the spacer layer may comprise a material selected from the group consisting of: GaAs, GaAsSb, GaAsPSb, InGaAs, InGaAsN, AlGaAs, AlGaAsSb, AlGaAsP, InAlGaAs, and AlGaAsN. It should be noted that the spacer layer may be P-type, undoped or N-type; preferably, the spacer layer is undoped or N-type; and optimally, the spacer layer is N-type, with a doping concentration greater than $1\times10^{15}/cm^3$; preferably, between $1\times10^{15}/cm^3$ and $1\times10^{19}/cm^3$; and optimally, between $1\times10^{16}/cm^3$ and $5\times10^{18}/cm^3$. It should be noted that the thickness of the spacer layer is between 0.1 nm-100 nm; preferably, between 3 nm-80 nm; and optimally, between 5 nm-50 nm.

Figure 2:
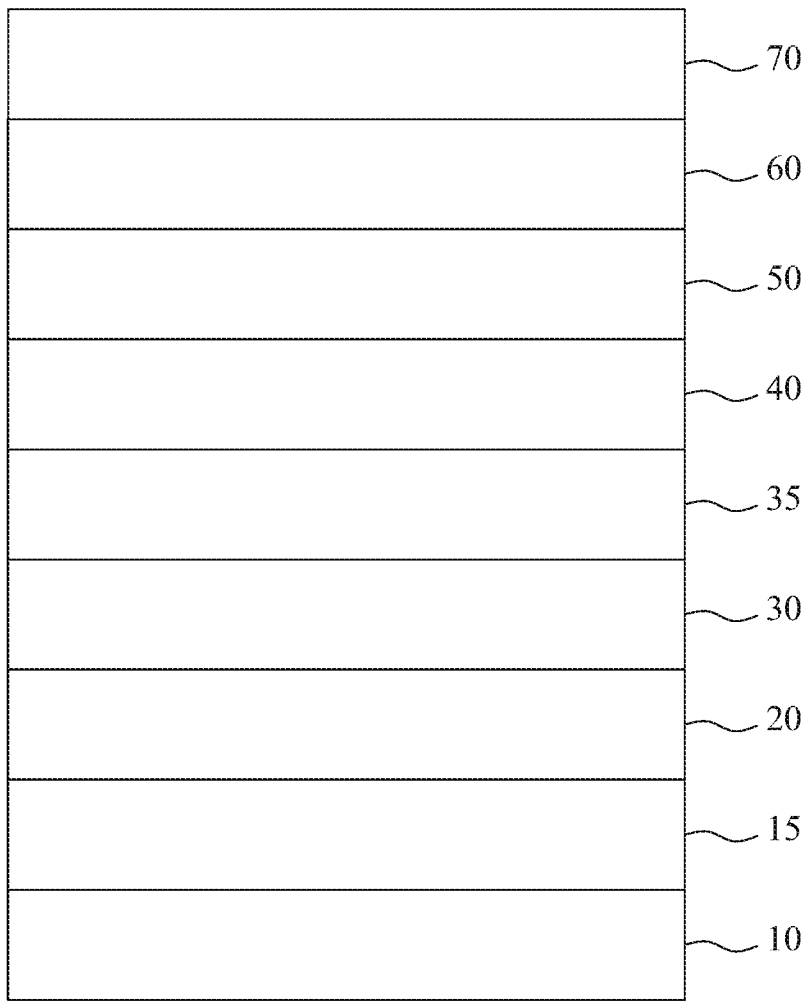
FIG. 2 shows a schematic view of a heterojunction bipolar transistor structure with a bandgap graded hole barrier layer in accordance with the second exemplary embodiment of the present invention.

FIG. 2 shows a schematic view of a heterojunction bipolar transistor structure with a bandgap graded hole barrier layer in accordance with the second exemplary embodiment of the present invention. As shown in FIG. 2, the HBT structure with a bandgap graded hole barrier layer of the second embodiment comprises: an intermediate composite layer 15, a sub-collector layer 20, a collector layer 30, a hole barrier layer 35, a base layer 40, an emitter layer 50, an emitter cap layer 60, and an ohmic contact layer 70, all formed sequentially on a substrate 10 from bottom up. It should be noted that the second embodiment shown in FIG. 2 differs from the first embodiment shown in FIG. 1 in that the intermediate composite layer 15 is provided between the substrate 10 and the sub-collector layer 20. The remaining layers in the second embodiment are the same as in the first embodiment, and the details will not be repeated here.

In an embodiment, the intermediate composite layer 15 comprises at least a buffer layer (not shown), and the buffer layer comprises a group III-V semiconductor. Alternatively, the intermediate composite layer 15 may comprise a field effect transistor (FET).

Moreover, the intermediate composite layer 15 may also comprise a pseudomorphic high electron mobility transistor (pHEMT), and the pHEMT comprises at least a buffer layer, a first donor layer, a first spacer layer, a channel layer, a second spacer layer, a second donor layer, a Schottky layer, an etch stop layer, and a cap layer (not shown) for ohmic contact, all formed sequentially on a substrate 10 from bottom up. In particular, the buffer layer comprises a group III-V semiconductor. The first donor layer or the second donor layer comprise a N-type material selected from the group consisting of: GaAs, AlGaAs, InAlGaP, InGaP and InGaAsP; the first spacer layer or the second spacer layer comprise a material selected from the group consisting of: GaAs, AlGaAs, InAlGaP, InGaP, and InGaAsP; the channel layer comprises a material selected from the group consisting of: GaAs, InGaAs, AlGaAs, InAlGaP, InGaP, and InGaAsP; the Schottky layer comprises a material selected from the group consisting of: GaAs, AlGaAs, InAlGaP, InGaP, and InGaAsP; the etch stop layer comprises a material selected from the group consisting of: GaAs, AlGaAs, InAlGaP, InGaAsP, InGaP, and AlAs; and the cap layer comprises an N-type group III-V semiconductor.

Figure 3A:
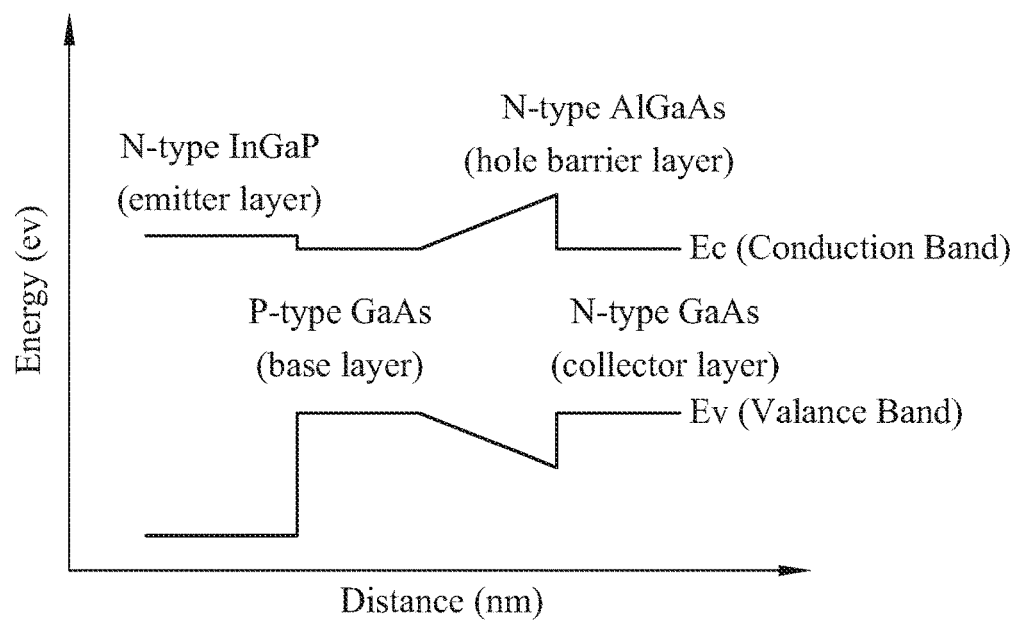
FIG. 3a and FIG. 3b show schematic views of the energy band diagram of the bandgap graded hole barrier layer of heterojunction bipolar transistor structure in accordance with an exemplary embodiment of the present invention.
Figure 3B:
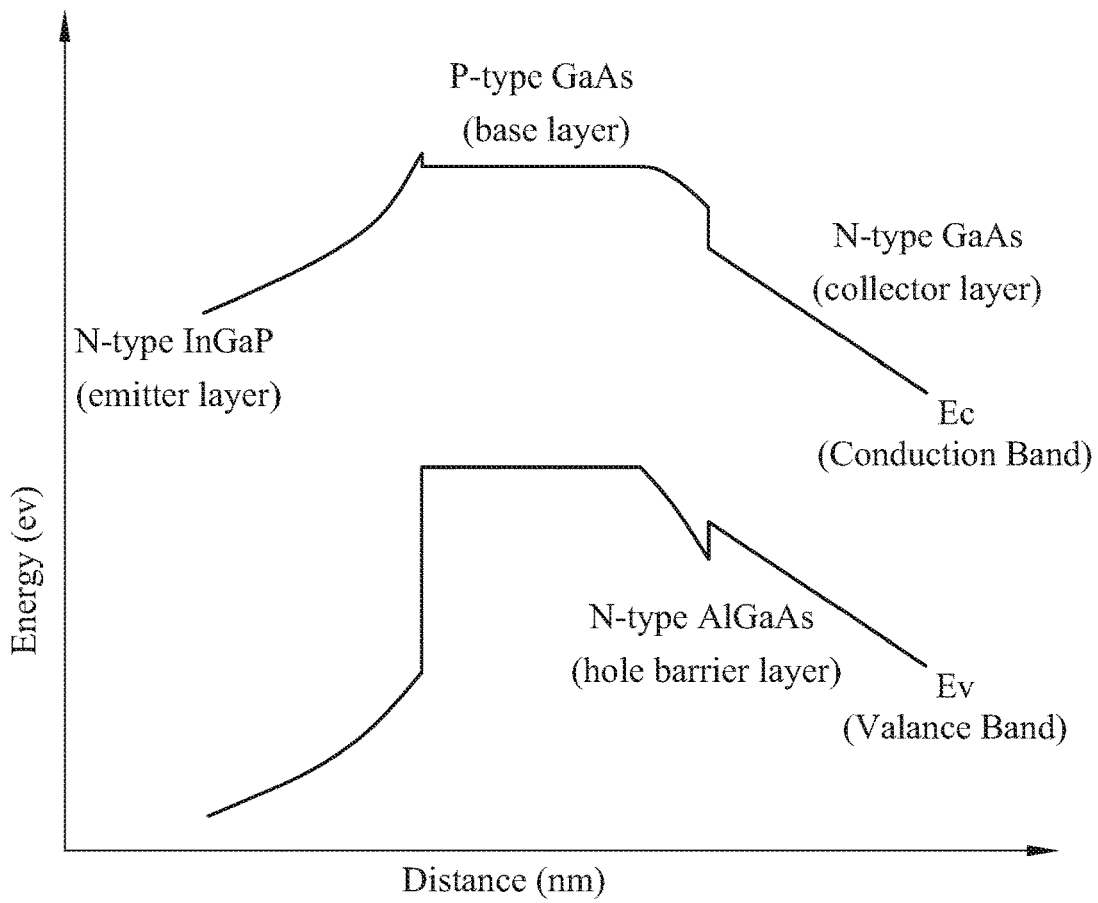
Figure 4A:
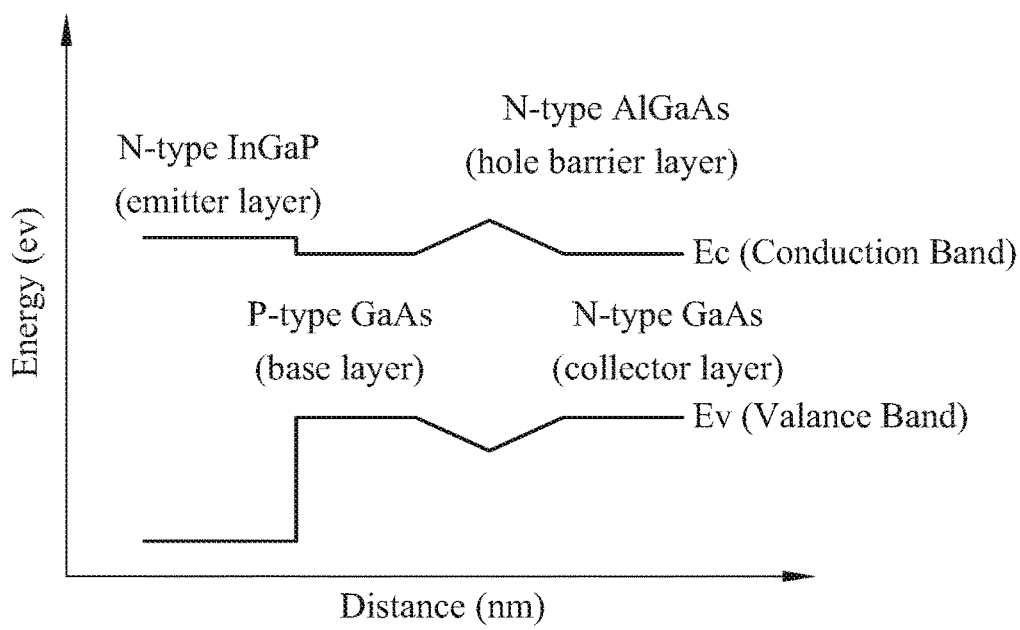
FIG. 4a and FIG. 4b show schematic views of the energy band diagram of the bandgap graded hole barrier layer of heterojunction bipolar transistor structure in accordance with another exemplary embodiment of the present invention.
Figure 4B:
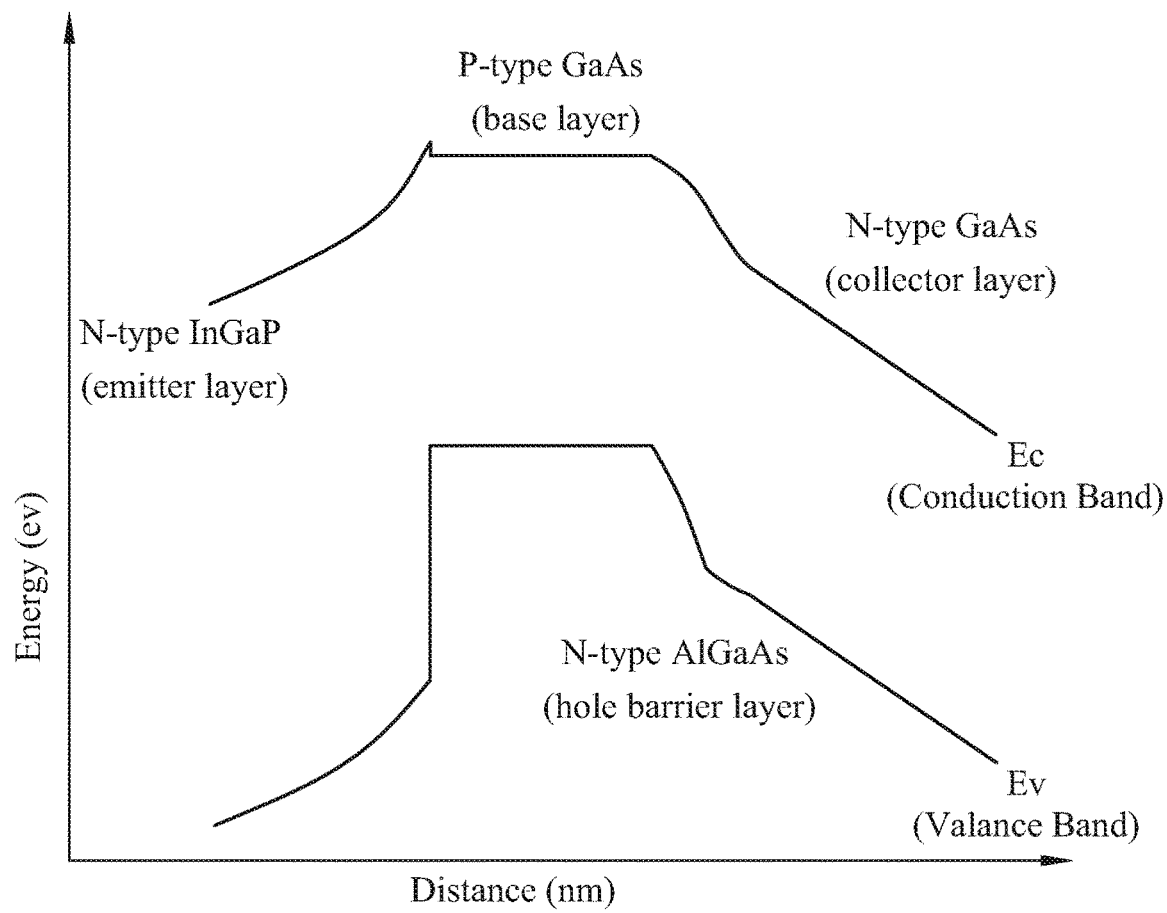
Figure 4C:
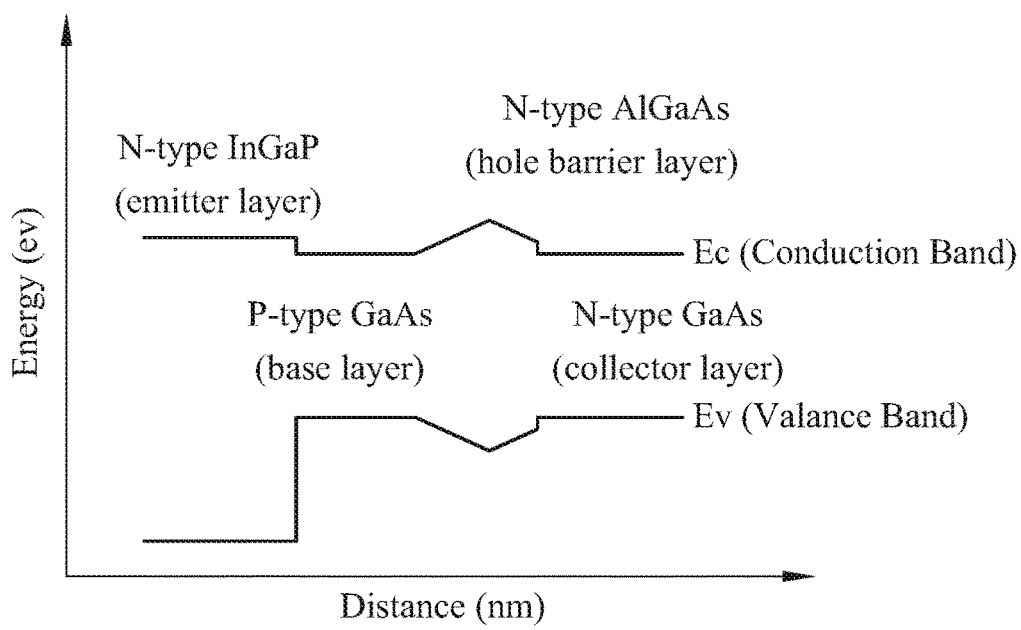
FIGS. 4c and 4d show schematic views of the energy band diagram of the bandgap graded hole barrier layer of heterojunction bipolar transistor structure in accordance with another exemplary embodiment of the present invention.
Figure 4D:
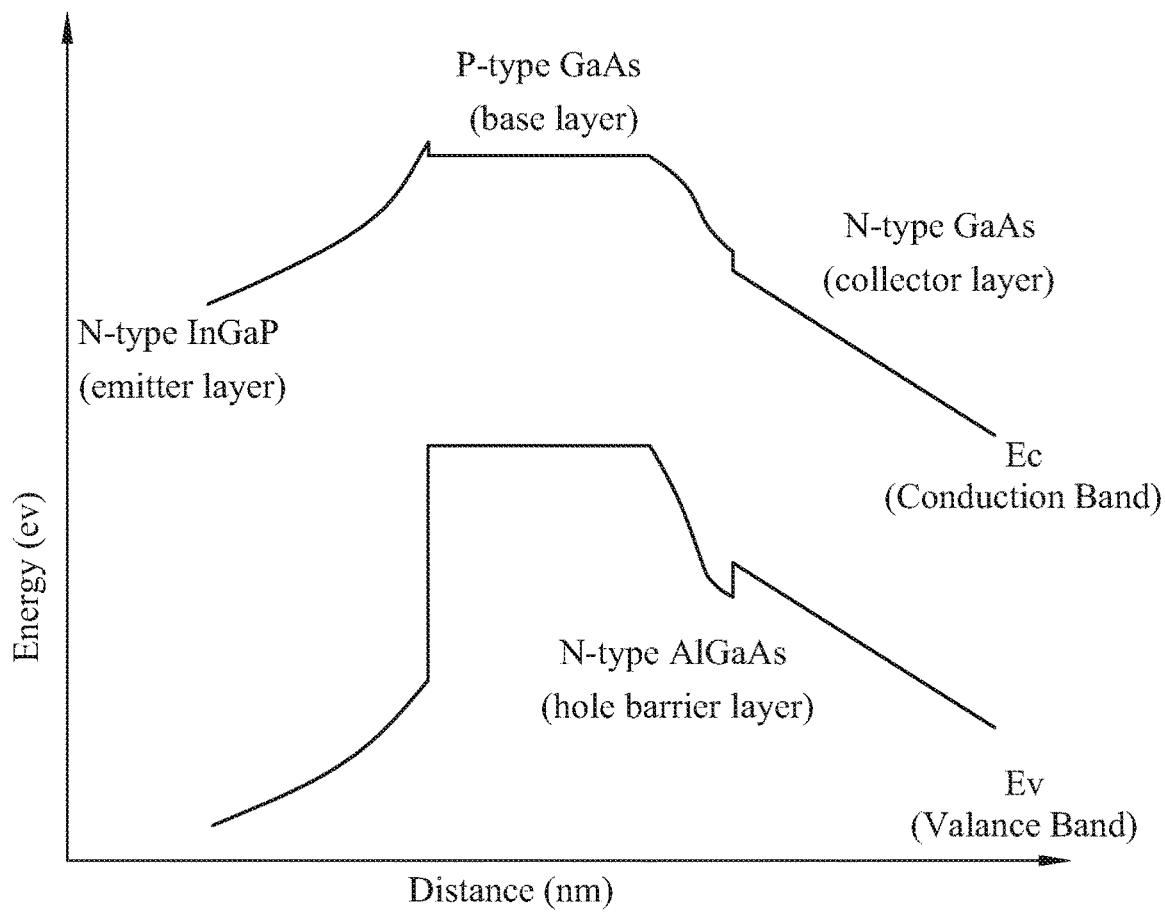
Figure 5A:
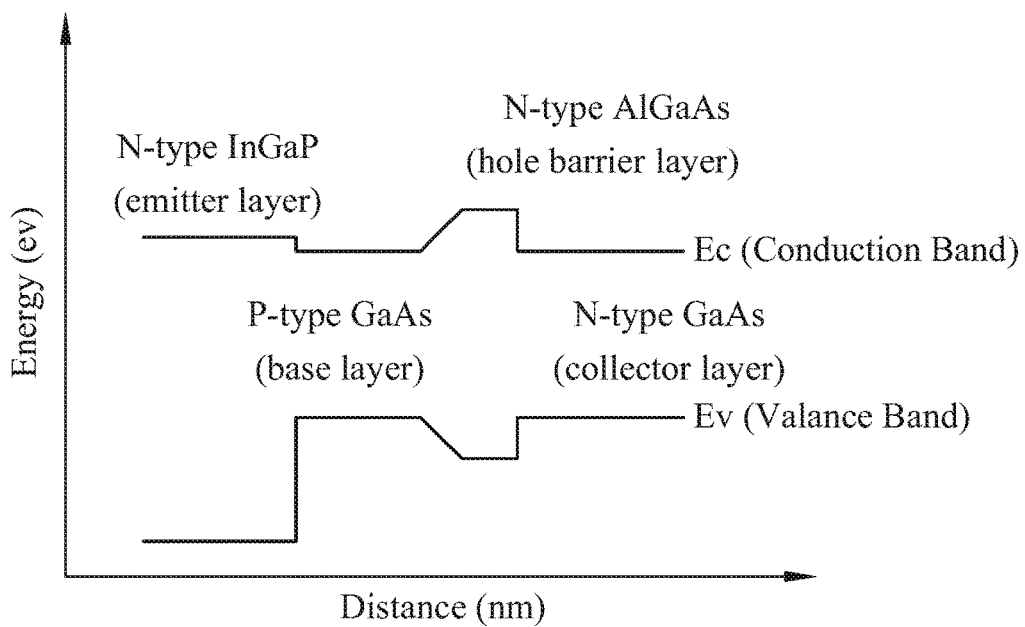
FIG. 5a and FIG. 5b show schematic views of the energy band diagram of the bandgap graded hole barrier layer of heterojunction bipolar transistor structure in accordance with yet another exemplary embodiment of the present invention.
Figure 5B:
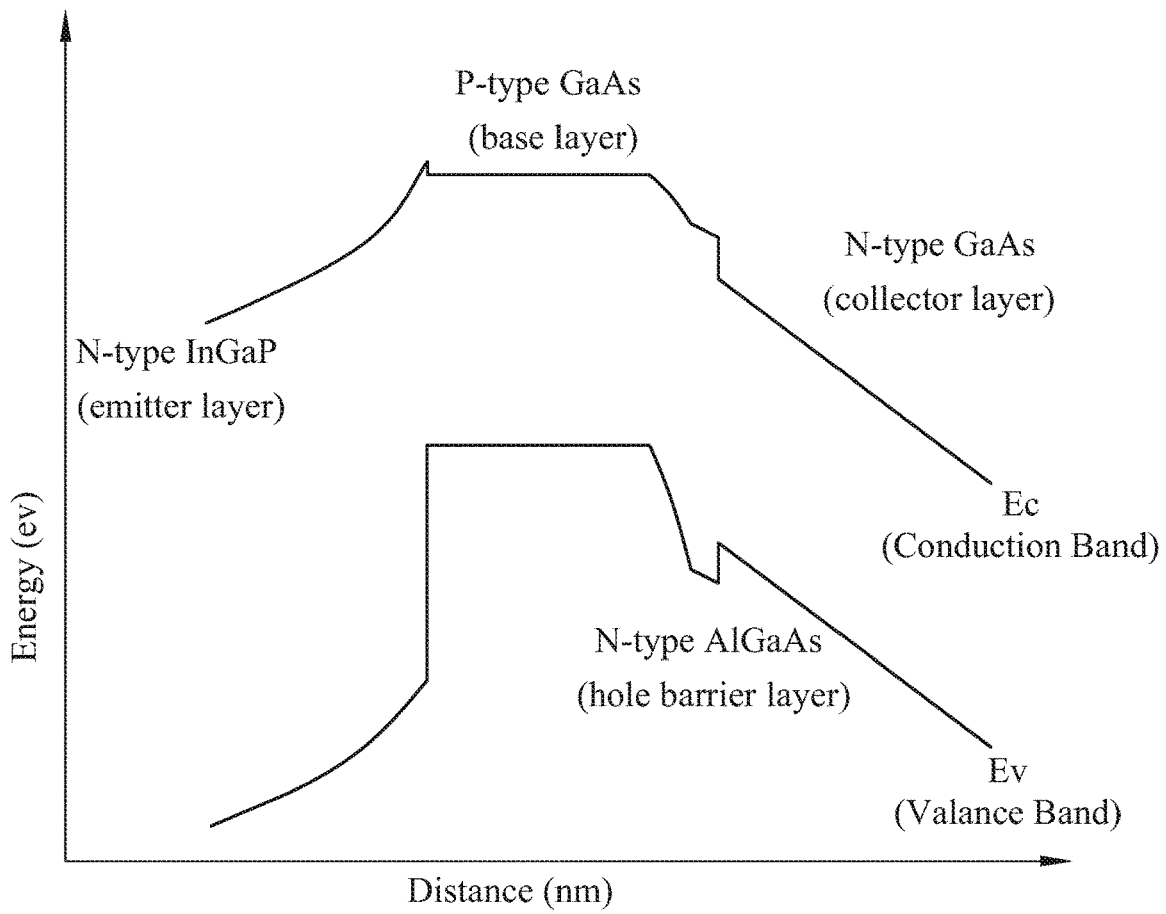
Figure 6A:
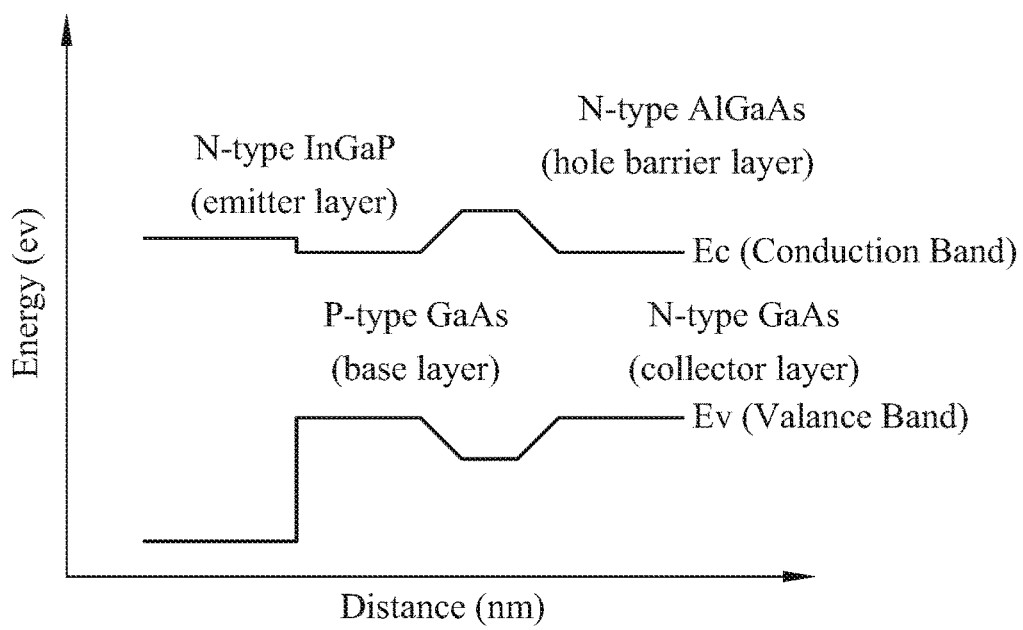
FIG. 6a and FIG. 6b show schematic views of the energy band diagram of the bandgap graded hole barrier layer of heterojunction bipolar transistor structure in accordance with yet another exemplary embodiment of the present invention.
Figure 6B:
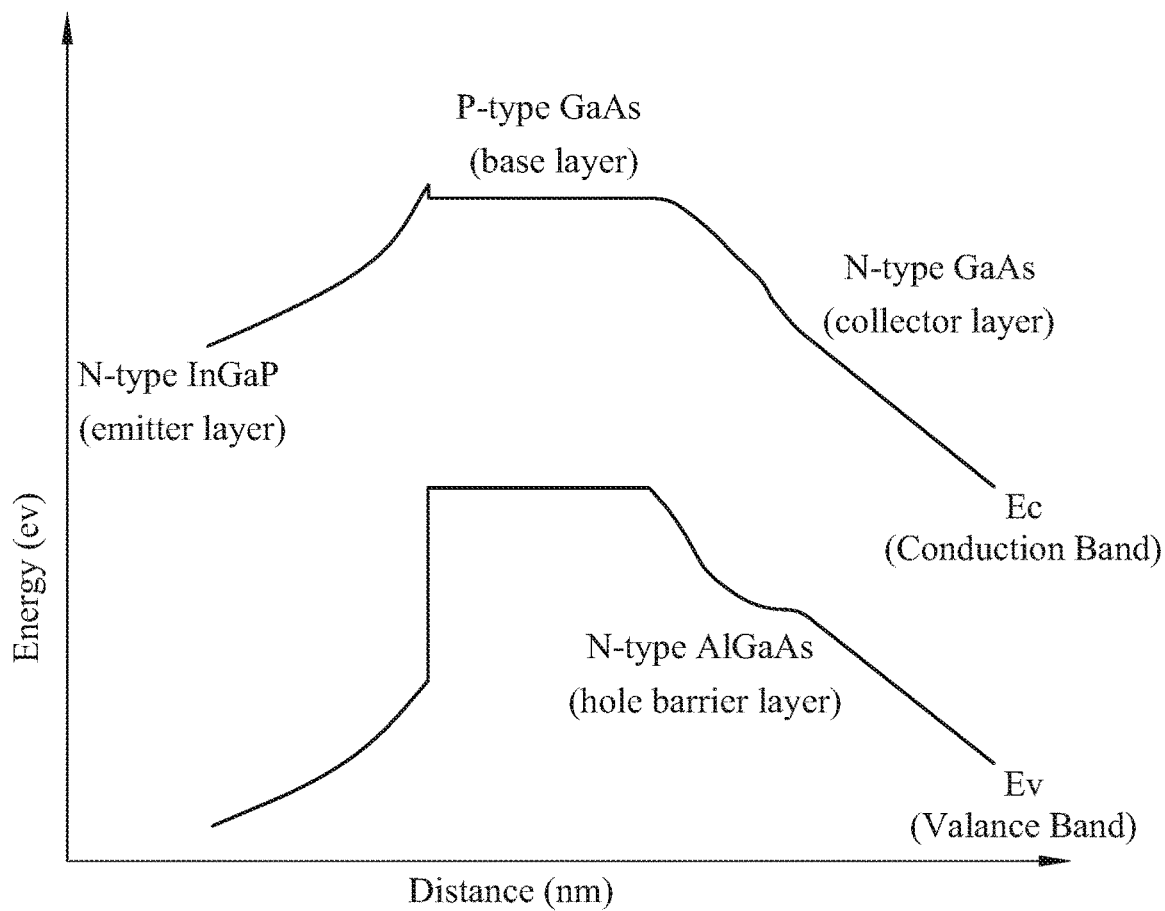

FIG. 3a and FIG. 3b show schematic views of the energy band diagram of the bandgap graded hole barrier layer of heterojunction bipolar transistor structure in accordance with an exemplary embodiment of the present invention. The bandgap increasing process of the hole barrier layer 35 from the base layer 40 towards the collector layer 30 comprises at least one or more segments of linear graded bandgap, nonlinear graded bandgap, step graded bandgap, or a combination thereof, wherein, the bandgap of the hole barrier layer 35 may start from the bandgap of base layer 40 in the bandgap increasing process, but is not limited thereto. Furthermore, FIG. 4a and FIG. 4b show schematic views of the energy band diagram of the bandgap graded hole barrier layer of heterojunction bipolar transistor structure in accordance with another exemplary embodiment of the present invention, wherein the graded bandgap of the hole barrier layer 35 further comprises a bandgap decreasing process after the bandgap increasing process from the base layer 40 towards the collector layer 30, the bandgap of the hole barrier layer 35 may end to the bandgap of collector layer 30 in the decreasing bandgap process, but is not limited thereto, for example, as shown in FIG. 4c and FIG. 4d, the bandgap of the hole barrier layer 35 is not end to the bandgap of collector layer 30 in the decreasing bandgap process. The bandgap of the hole barrier layer 35 comprises at least one or more segments of linear graded bandgap, nonlinear graded bandgap, step graded bandgap, or a combination thereof, wherein the bandgap of the hole barrier layer 35 may start from the bandgap of base layer 40 in the increasing bandgap process, but is not limited thereto. Furthermore, FIG. 5a and FIG. 5b show schematic views of the energy band diagram of the bandgap graded hole barrier layer of heterojunction bipolar transistor structure in accordance with yet another exemplary embodiment of the present invention, wherein the graded bandgap of the hole barrier layer 35 further comprises at least a layer with constant bandgap during and/or after the bandgap increasing process from the base layer 40 towards the collector layer 30. The bandgap of the hole barrier layer 35 comprises at least one or more segments of linear graded bandgap, nonlinear graded bandgap, step graded bandgap, or a combination thereof, wherein, the bandgap of the hole barrier layer 35 may start from the bandgap of base layer 40 in the bandgap increasing process, but is not limited thereto. In addition, refer to FIG. 6a and FIG. 6b. FIG. 6a and FIG. 6b show schematic views of the energy band diagram of the bandgap graded hole barrier layer of heterojunction bipolar transistor structure in accordance with yet another exemplary embodiment of the present invention, wherein the graded bandgap of the hole barrier layer 35 further comprises at least a layer with a constant bandgap during and/or after the bandgap increasing process from the base layer 40 towards the collector layer 30 and also comprises a bandgap decreasing process after the bandgap increasing process of the hole barrier layer 35 from the base layer 40 towards the collector layer 30 and further comprises at least a layer with constant bandgap during and/or after the bandgap decreasing process. The bandgap of the hole barrier layer 35 comprises at least one or more segments of linear graded bandgap, nonlinear graded bandgap, step graded bandgap, or a combination thereof, wherein, the bandgap of the hole barrier layer 35 may start from the bandgap of the base layer 40 in the bandgap increasing process, but is not limited thereto. Or, in another embodiment of the present invention (not shown), the graded bandgap of the hole barrier layer 35 further comprises a bandgap decreasing process after the bandgap increasing process from the base layer 40 towards the collector layer 30 and comprises at least a layer with a constant bandgap during and/or after the bandgap decreasing process; the bandgap of the hole barrier layer 35 comprises at least one or more segments of linear graded bandgap, nonlinear graded bandgap, step graded bandgap, or a combination thereof. Wherein the bandgap of the hole barrier layer 35 may start from the bandgap of the base layer 40 in the bandgap increasing process, but is not limited thereto, the bandgap of the hole barrier layer 35 may end to the bandgap of collector layer 30 in the decreasing bandgap process, but is not limited thereto.

Therefore, the hole barrier layer having graded bandgap provides the HBT with the advantages of better device performance and ease of fabrication. In particular, the device performance will be better when operating at high voltages or high currents, and the saturation power will not be suppressed at high power operation. The hole barrier layer having graded bandgap allows to reduce the electron barrier height and to maintain a sufficient hole barrier height.

Figure 7:
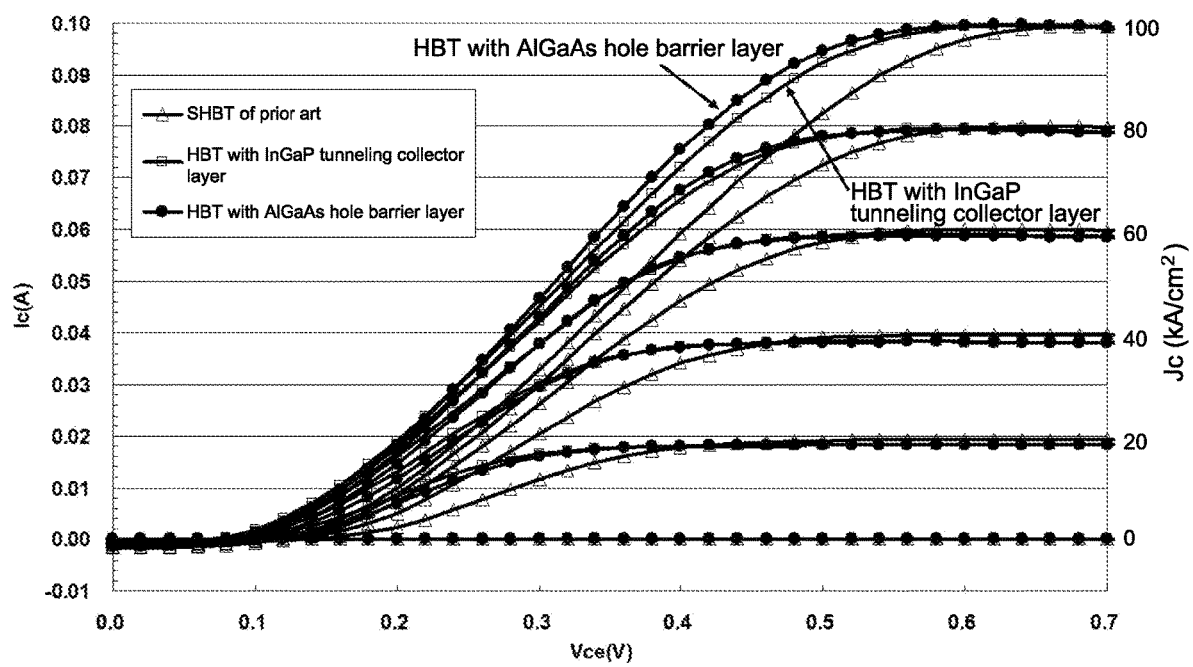
FIG. 7 shows a comparison between common-emitters I-V characteristics of an embodiment of the present disclosure and a prior art HBT.

FIG. 7 shows a comparison between common-emitters I-V characteristics of an embodiment of the present disclosure and a prior art HBT. In FIG. 7, both of the collector layers of HBTs of the embodiment and prior art are N-type GaAs, and the hole barrier layer comprises a composition graded $Al_xGa_{1-x}As$ layer and the largest value of x is about 0.12, The thickness of the hole barrier layer is about 150 nm. As compared with the prior art, the HBT having $Al_xGa_{1-x}As$ hole barrier layer not only reduces the offset voltage but also reduces the knee voltage, it should be noted that even if the collector current density (Jc) is as high as 100kA/cm², the knee voltage of HBT having the hole barrier layer can still be lower than that of the prior art; wherein the offset voltage refers to the collector-emitter voltage $V_{CE}$ when the collector current Ic is zero, and the knee voltage refers to the voltage at the boundary between the saturation region and the linear region. Meanwhile, the saturation power Psat under the high power operation is higher than the conventional HBT by 1.5 dBm. Therefore, the embodiment provided herein can solve some problems in the prior art, improve the HBT device performance or high frequency characteristics, and further improve the overall performance of the PA.

Figure 8:
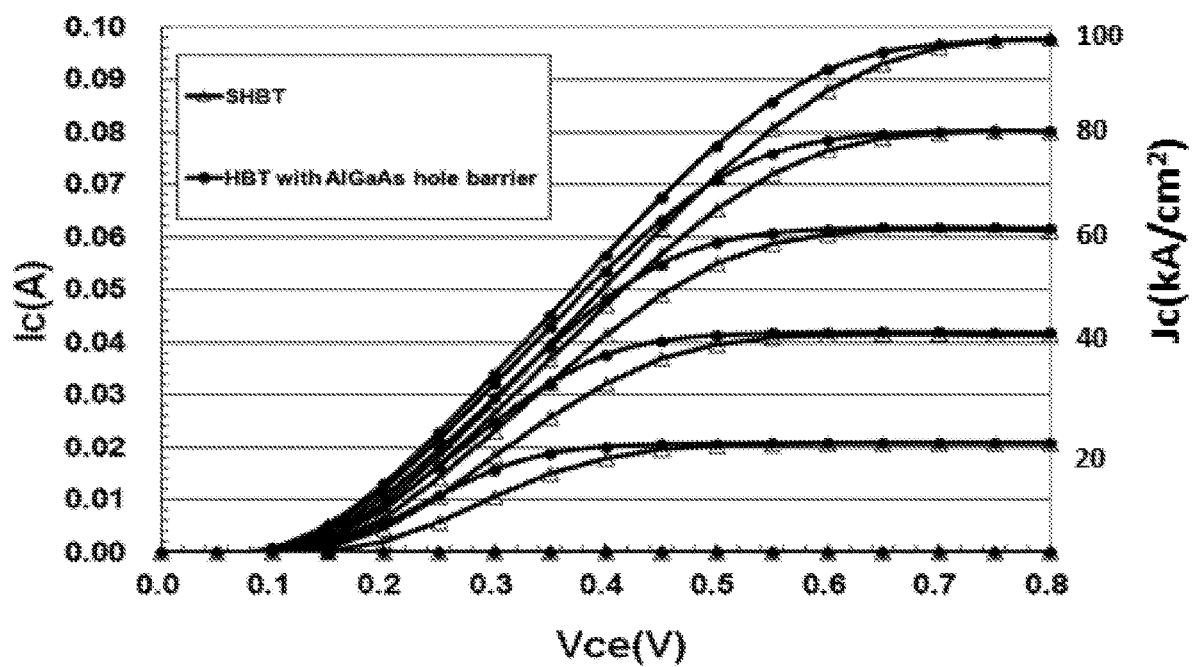
FIG. 8 shows a comparison between common-emitters I-V characteristics of an embodiment of the present disclosure and a prior art HBT.

FIG. 8 shows a comparison between common-emitters I-V characteristics of an embodiment of the present disclosure and a prior art HBT. In FIG. 8, portions of the collector layers of both HBTs in the embodiment and prior art are undoped GaAs, and the hole barrier layer comprises a composition graded $Al_xGa_{1-x}As$ layer and the largest value of x is about 0.12, The thickness of the hole barrier layer is about 150 nm. As compared with the prior art, the HBT having $Al_xGa_{1-x}As$ hole barrier layer not only reduces the offset voltage but also reduces the knee voltage, it is worth noted that even if the collector current density (Jc) is as high as 100kA/cm², the knee voltage of HBT having the hole barrier layer can still be lower than that of the prior art. Therefore, when the hole barrier layer is provided in HBT, even a portion of collector layer is undoped GaAs, the HBT device performance is improved, and the overall performance of the PA is further improved.

Figure 9:
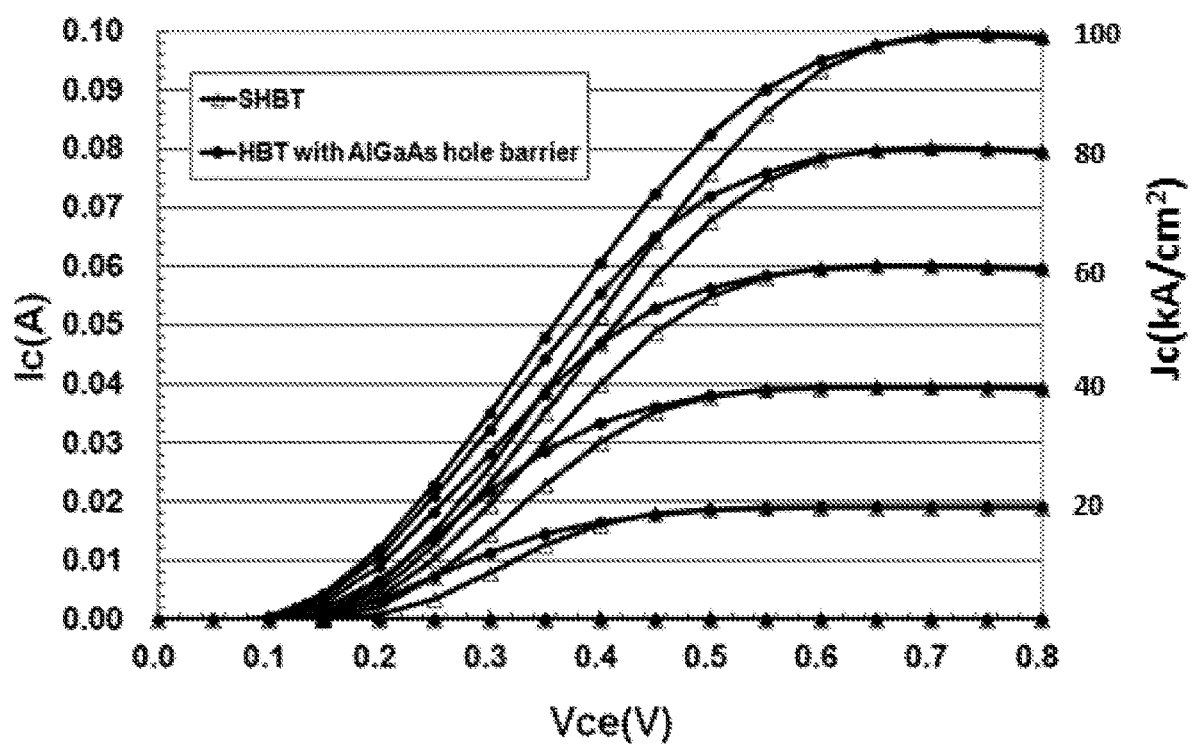
FIG. 9 shows a comparison between common-emitters I-V characteristics of an embodiment of the present disclosure and a prior art HBT.
Figure 10:
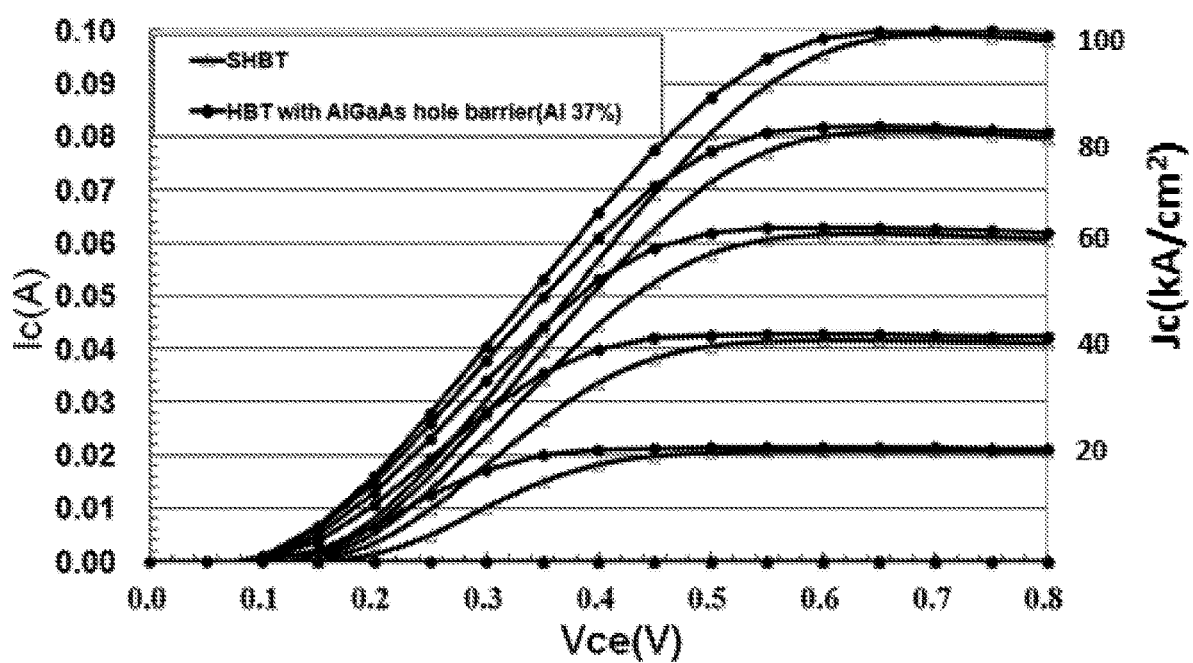
FIG. 10 shows a comparison between common-emitters I-V characteristics of an embodiment of the present disclosure and a prior art HBT.

FIG. 9 shows a comparison between common-emitters I-V characteristics of an embodiment of the present disclosure and a prior art HBT. In FIG. 9, portions of the collector layers of both HBTs in the embodiment and prior art are P-type GaAs, and the hole barrier layer comprises a composition graded $Al_xGa_{1-x}As$ layer and the largest value of x is about 0.12, The thickness of the hole barrier layer is about 150 nm. As compared with the prior art, the HBT having $Al_xGa_{1-x}As$ hole barrier layer not only reduces the offset voltage but also reduces the knee voltage, it is worth noted that even if the collector current density (Jc) is as high as 100kA/cm², the knee voltage of HBT having the hole barrier layer can still be lower than that of the prior art. Therefore, when the hole barrier layer is provided in HBT, even a portion of collector layer is P-type GaAs, the HBT device performance is improved, and the overall performance of the PA is further improved FIG. 10 shows a comparison between common-emitters I-V characteristics of an embodiment of the present disclosure and a prior art HBT. In FIG. 10, portions of the collector layers of both HBTs in the embodiment and prior art are N-type GaAs, and the hole barrier layer comprises a composition graded $Al_xGa_{1-x}As$ layer and the largest value of x is about 0.37, The thickness of the hole barrier layer is about 45 nm. As compared with the prior art, the HBT having $Al_xGa_{1-x}As$ hole barrier layer not only reduces the offset voltage but also reduces the knee voltage, it is worth noted that even if the collector current density (Jc) is as high as 100kA/cm$^2$, the knee voltage of HBT having the hole barrier layer can still be lower than that of the prior art. Therefore, when the hole barrier layer is provided in HBT, even a portion of collector layer is N-type GaAs and the Al composition x is as high as 0.37, the HBT device performance is improved, and the overall performance of the PA is further improved.

When the aluminum composition of the $Al_xGa_{1-x}As$ hole barrier layer increases, for example, when the largest value of x is increased, the bandgap of the hole barrier layer can be increased, in such way the offset voltage of the HBT can be reduced, thus the knee voltage of the HBT can also be decreased.

However, when the bandgap of the hole barrier layer becomes larger, the electron barrier height at the junction of base and collector layer could also be increased. When the electron barrier height is increased, the electrons flowing from the base layer to the collector layer would be blocked, and cause the collector current blocking effect. The collector current blocking effect will cause the knee voltage to be increased, when the collector current blocking effect is stronger, such that the knee voltage will also be increased. In this case, the reduction of the knee voltage by reducing the offset voltage could be countervailed. When the collector current blocking effect is very strong, as compared with the prior art HBT, the knee voltage of the HBT having the hole barrier layer will be increased instead of being decreased.

It should be noted that the collector current blocking effect is also related to the collector current density. The larger the collector current density is, the easier a stronger collector current blocking effect is caused.

In some embodiments of the present disclosure, the aluminum composition in the hole barrier layer or the largest value of x (the aluminum composition) is about 0.8, 0.7, 0.6, 0.5, 0.4 or 0.2.

In an embodiment of the present disclosure, the largest value of x (the aluminum composition) in the hole barrier layer is less than 0.22, and the values of y, z, r, and w are less than or equal to 0.1.

It should be noted that the largest aluminum composition or the largest value of x (the aluminum composition) in the hole barrier layer is determined based on the collector current density required for operation which will not cause a serious collector current blocking effect in the HBT. The serious collector current blocking effect refers to a situation in which the knee voltage, compared with the knee voltage in prior art HBT, no longer decreases and even increases after the aluminum composition value or the largest value of x in the hole barrier layer exceeds an aluminum composition value.

In addition, the collector current blocking effect is related to the doping profile, doping concentration, layer thickness and material of the collector layer. The collector current blocking effect is also related to the bandgap graded profile, doping profile, doping concentration, layer thickness or material of the hole barrier layer or material of the base layer.

Since the bandgap graded hole barrier layer comprises arsenic-containing materials, arsenic-phosphorus intermixing compound will not be formed at the junction of the hole barrier layer and the mainly arsenic-containing base layer or collector layer. In addition to ease of the etching process and the improvement of the process yield, it is also easy to fabricate the graded bandgap at the junctions with the base layer or the collector layer to help reducing or eliminating the conduction band electron barrier at the junction of the hole barrier layer and the base layer or collector layer, as well as helping to maintain sufficient hole barrier height at the junction of the hole barrier layer and the base layer, and to effectively reduce the depth of the valence band quantum well at the junction of the hole barrier layer and the collector layer or even eliminate the valence band quantum well. In addition, the valence band discontinuity between the group of hole barrier layer materials and the base layer or the collector layer is smaller than the valence band discontinuity between InGaP or InGaAsP and the base layer or the collector layer and can be adjusted by varying the composition to reduce the valence band discontinuities can also reduce blocking too much holes at the junction of the base layer and the hole barrier layer at higher current density, or avoid forming excessively deep hole quantum well at the junction of the hole barrier layer and the collector layer, which causes the excessive accumulation of holes in the quantum well to affect the efficiency and RF performance of the power amplifier in high current density operation. Furthermore, the sufficient hole barrier height at the junction of the hole barrier layer and the base layer or the sufficient hole quantum well at the junction of the hole barrier layer and the collector layer can also protect the HBT device at high power operation to avoid HBT damage caused by extremely high operation power, so as to improve the ruggedness of the HBT device.

In one aspect, according to the above embodiments of the present invention, to form a sufficient hole barrier height at the junction between the bandgap graded hole barrier layer and the base layer or to form a sufficient hole quantum well at the junction of the hole barrier layer and the collector layer can protect the HBT in the high power operation to improve the ruggedness of the HBT. Because of under extremely high operation power, the hole barrier at the junction of the hole barrier layer and the base layer can block sufficient number of holes to change the electric field at the junction to cause collector current blocking effect or the hole quantum well at the junction of the hole barrier layer and the collector layer can accumulate sufficient number of holes to degrade RF performance of HBT, thereby preventing the HBT from damaging caused by extremely high operation power.

In an embodiment, the hole barrier layer further includes a wide bandgap layer, the wide bandgap layer provides a valence band discontinuity between the wide bandgap layer and its adjacent epitaxial layer, wherein a bandgap of the wide bandgap layer is at least greater than that of the base layer. and According to the embodiments shown in FIGS. 3a, 3b~FIGS. 6a, 6b, besides providing the gradually increasing bandgap in the hole barrier layer, the gradually decreasing bandgap and/or a constant bandgap may be further provided in the hole barrier layer, and the wide bandgap layer is formed in at least one of the above three. Specifically, the wide bandgap layer can be formed in at least one of the graded bandgaps and/or constant bandgap in the above-mentioned embodiments For simplifying FIG. 11a,11b-FIG. 15a, 15b, those example drawings only show the cases of no conduction band discontinuity between the hole barrier layer and the wide bandgap layer, it is obvious for the cases with/without the conduction band discontinuity between the hole barrier layer and the wide bandgap layer can apply to the embodiments of FIGS. 3a, 3b~FIGS. 6a, 6b, FIG. 11a,11b-FIG. 15a, 15b or other possible embodiments.

Figure 11A:
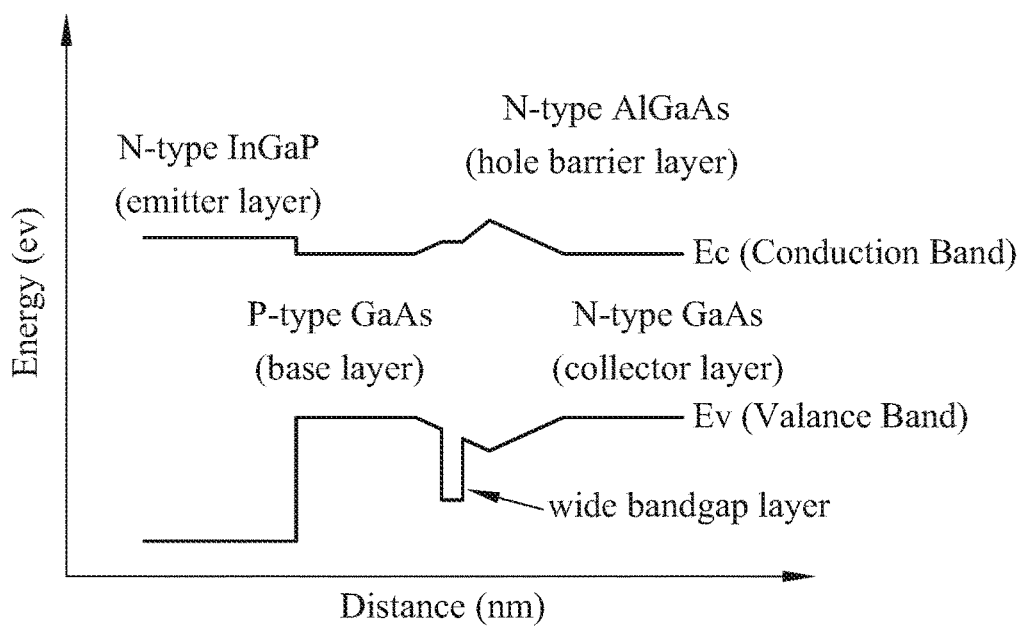
Figure 11B:
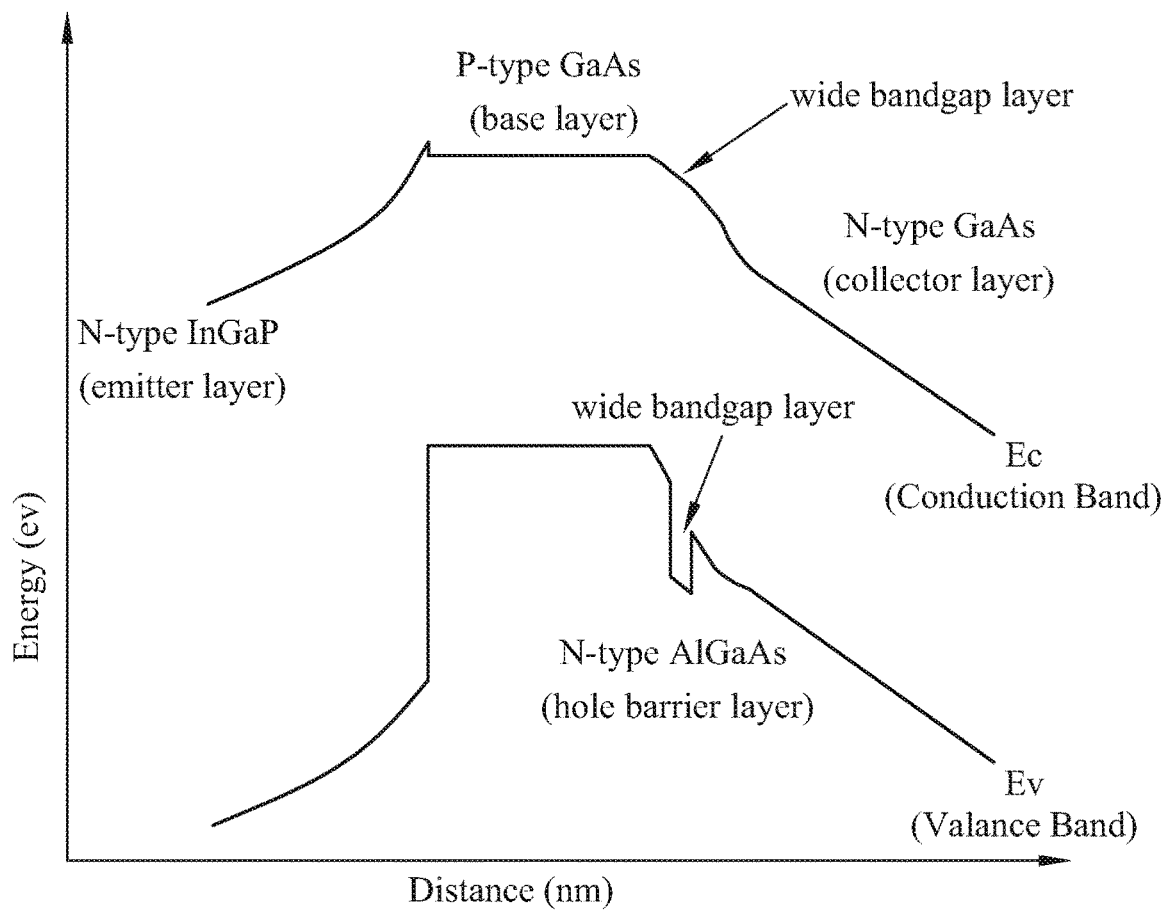
FIG. 11b illustrates a wide bandgap layer further formed in the embodiment of FIG. 4b.

As shown in FIG. 11a and FIG. 11b, FIG. 11a illustrates a wide bandgap layer further formed in the embodiment of FIG. 4a, wherein the wide bandgap layer is formed in the hole barrier layer with the bandgap increasing process.

Figure 12A:
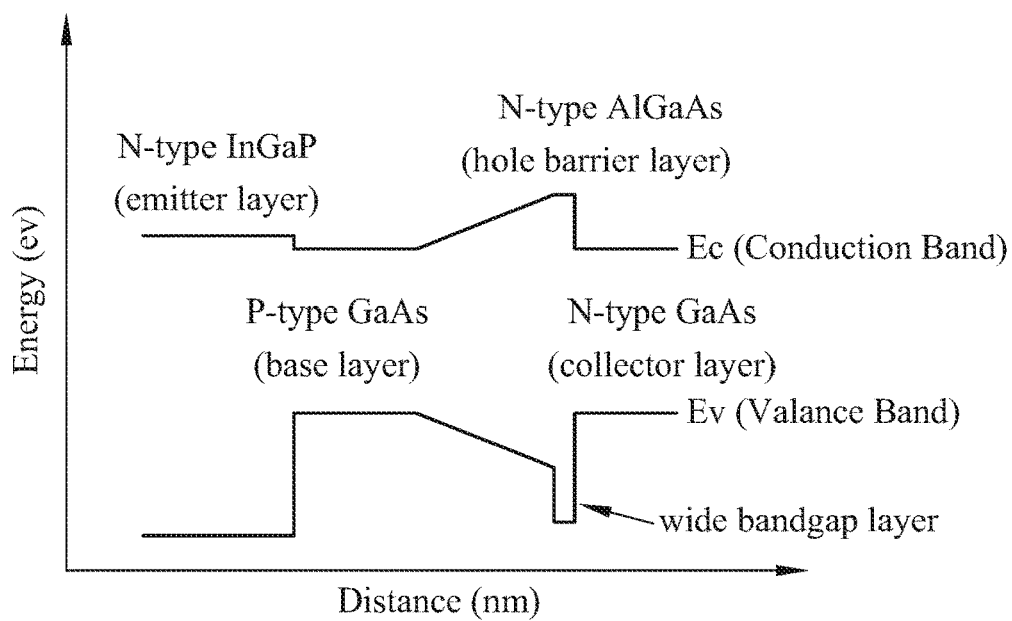
Figure 12B:
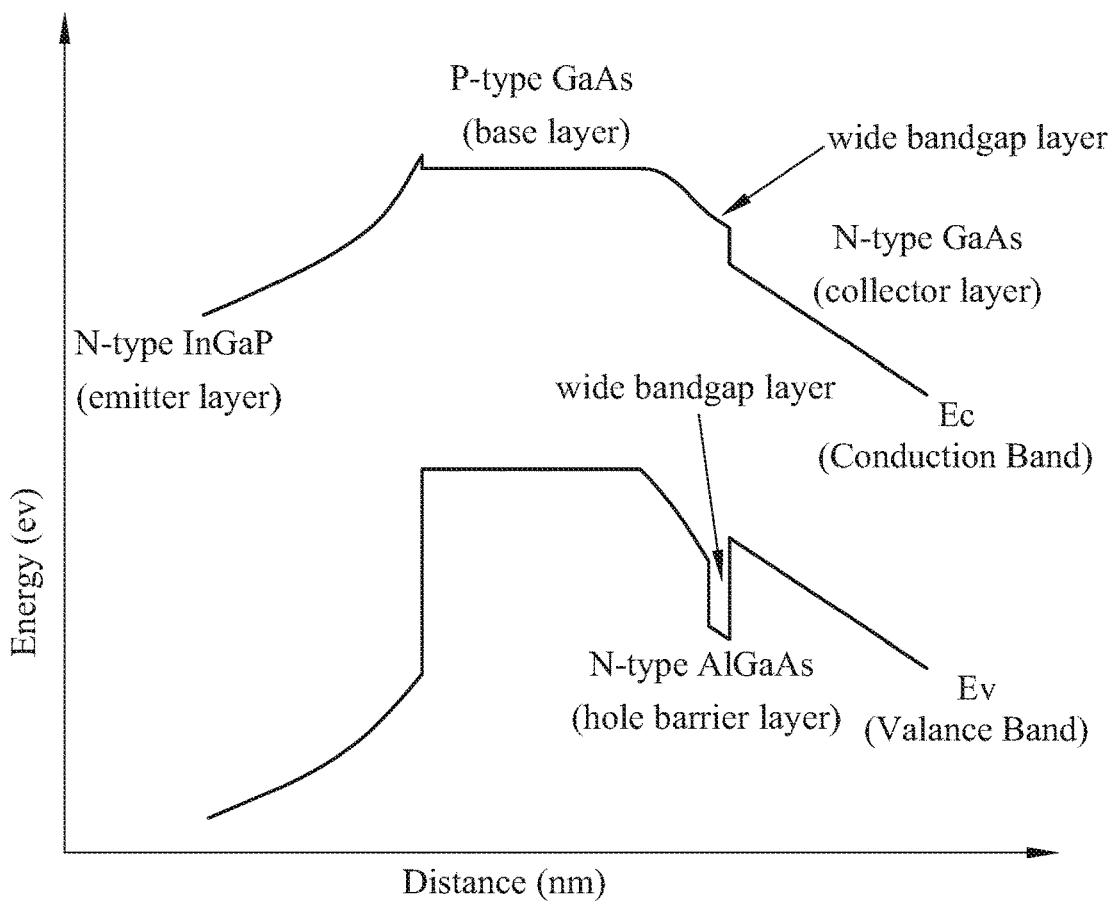
FIG. 12b illustrates a wide bandgap layer further formed in the embodiment of FIG. 3b.

As shown in FIG. 12a and FIG. 12b, FIG. 12a illustrates a wide bandgap layer further formed in the embodiment of FIG. 3a, wherein the wide bandgap layer is formed after the bandgap increasing process of the hole barrier layer.

Figure 13A:
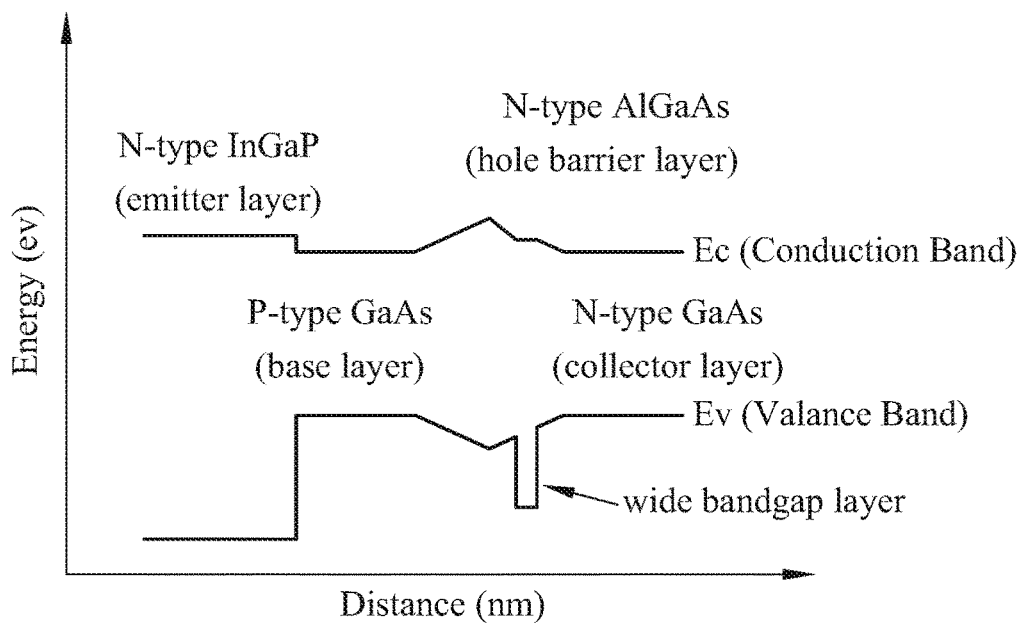
Figure 13B:
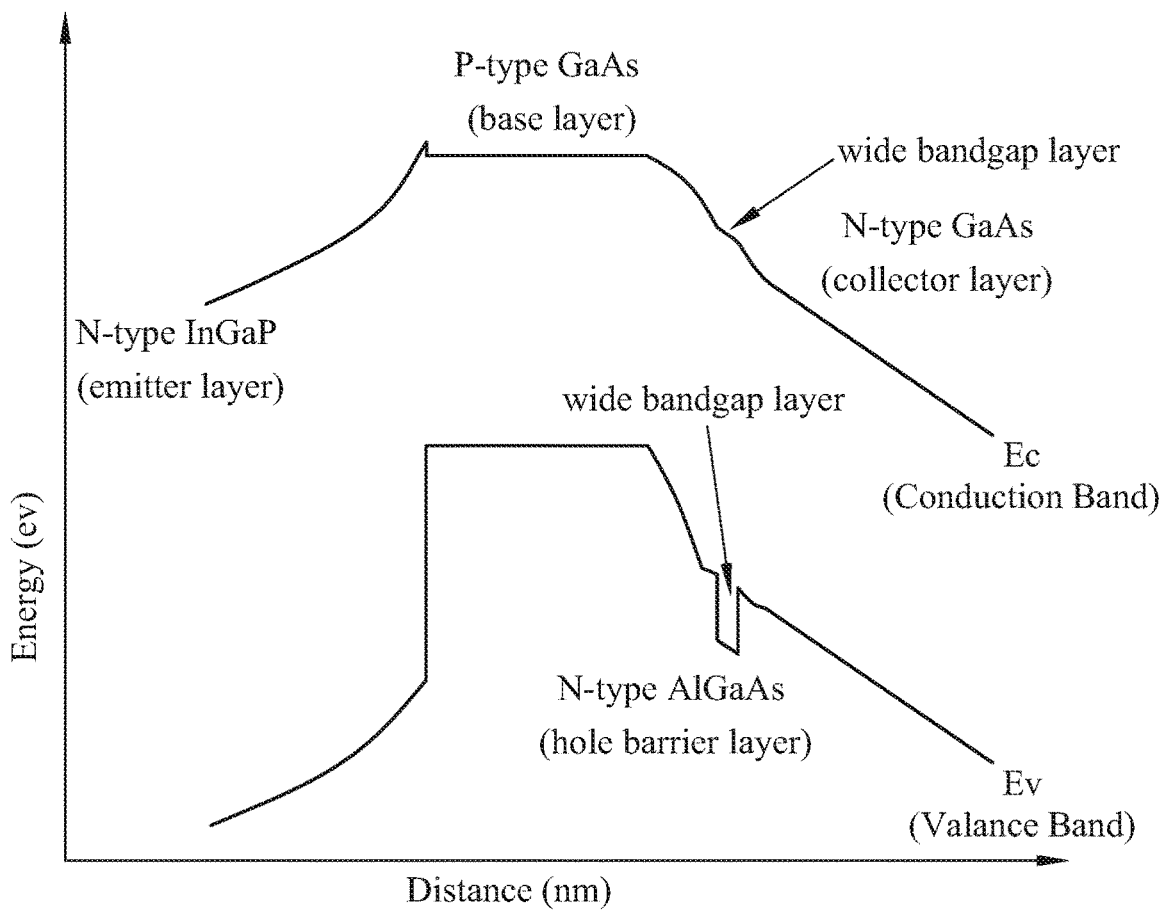
FIG. 13b illustrates a wide bandgap layer further formed in the embodiment of FIG. 4b.

As shown in FIG. 13a and FIG. 13b, FIG. 13a illustrates a wide bandgap layer further formed in the embodiment of FIG. 4a, wherein the wide bandgap layer is formed in the hole barrier layer with the bandgap decreasing process.

Figure 14A:
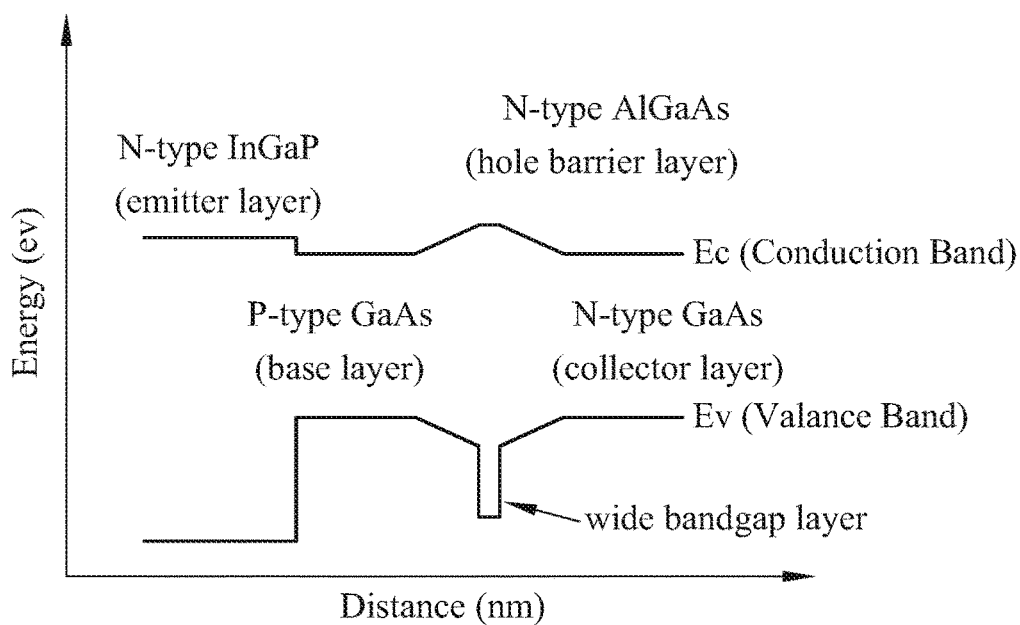
Figure 14B:
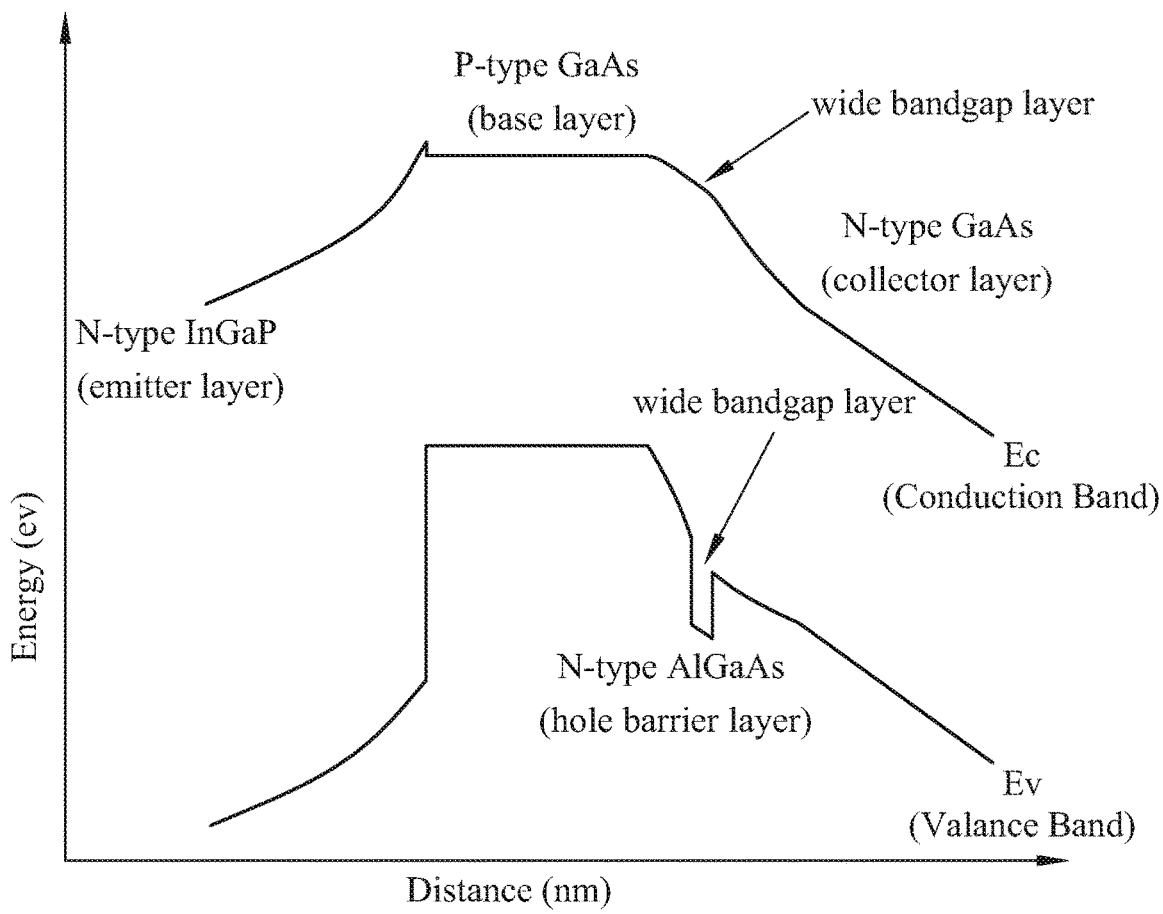
FIG. 14b illustrates a wide bandgap layer further formed in the embodiment of FIG. 4b.

As shown in FIG. 14a and FIG. 14b, FIG. 14a illustrates a wide bandgap layer further formed in the embodiment of FIG. 4a, wherein the wide bandgap layer is formed between the bandgap increasing process and the bandgap decreasing process.

Figure 15A:
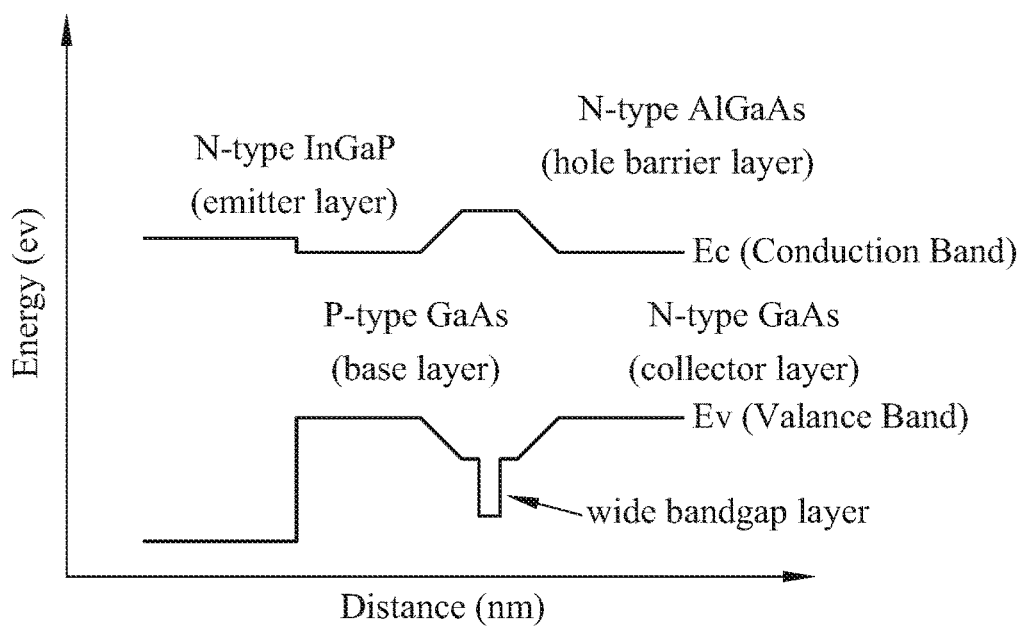
Figure 15B:
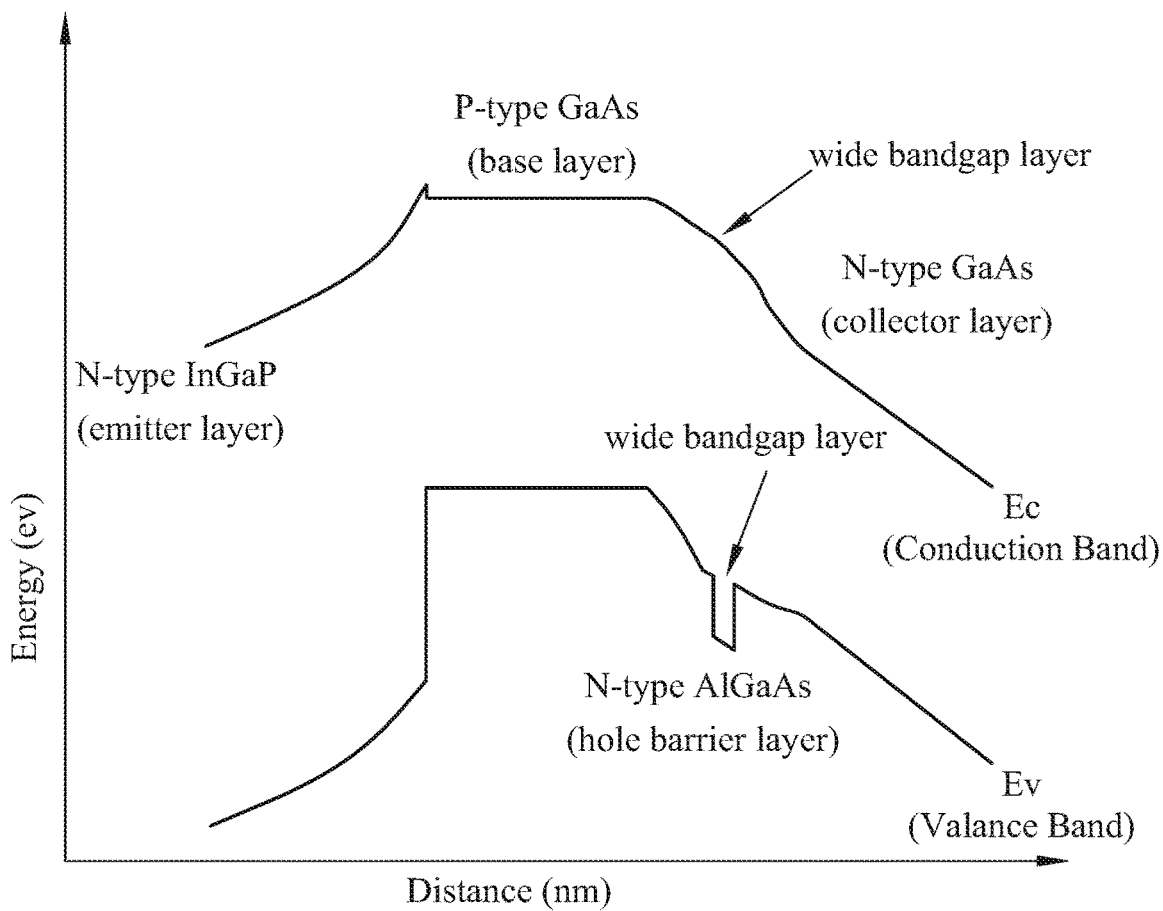
FIG. 15b illustrates a wide bandgap layer further formed in the embodiment of FIG. 6b.

Alternatively, as shown in FIG. 15a and FIG. 15b, FIG. 15a illustrates a wide bandgap layer further formed in the embodiment of FIG. 6a, wherein the wide bandgap layer is formed in the layer with constant bandgap of the hole barrier layer As shown in FIGS. 11a, 11b-FIGS. 15a, 15b, when the wide bandgap layer is provided in the hole barrier layer, the hole barrier height or the hole quantum well depth can be adjusted. Therefore, the efficiency, RF performance or ruggedness of the PA can be further improved.

Preferably, the wide bandgap layer includes AlGaAs, AlGaAsP, AlGaAsN, AlGaAsSb, AlGaAsBi, InGaP, InGaPN, InGaPSb, InGaPBi, InGaAsP, InGaAsPN, InGaAsPSb, InGaAsPBi, InAlGaP, InAlGaPN, InAlGaPSb, and InAlGaPBi or a combination of the materials mentioned above. Preferably, the thickness of the wide bandgap layer is equal to or less than 15 nm, wherein 0 is excluded. In some situations, the thickness of the wide bandgap layer may be thicker, for example, in the range of 15-50 nm.

The wide bandgap layer can be P-type, undoped, or N-type; preferably, the wide bandgap layer is undoped or N-type, and optimally, the wide bandgap layer is N-type with a doping concentration greater than $1\times10^{15}/cm^3$, preferably between $1\times10^{15}/cm^3$ and $1\times10^{19}/cm^3$, and optimally between $1\times10^{16}/cm^3$ and $5\times10^{18}/cm^3$.

According to some embodiments described above, a hole barrier layer with a graded bandgap provided in the HBT can reduce the knee voltage of the HBT or improve the efficiency or the linearity of the HBT or improve the RF performance or the ruggedness of the HBT.

Although the present invention has been described with reference to the preferred embodiments, it will be understood that the invention is not limited to the details described thereof. Various substitutions and modifications have been suggested in the foregoing description, and others will occur to those of ordinary skill in the art Therefore, all such substitution and modifications are intended to be embraced within the scope of the invention as defined in the appended claims.

What is claimed is:

1. A heterojunction bipolar transistor (HBT) structure with a bandgap graded hole barrier layer, comprising:
   a substrate;
   a sub-collector layer on the substrate, the sub-collector layer comprising an N-type group III-V semiconductor;
   a collector layer on the sub-collector layer, the collector layer comprising a group III-V semiconductor;
   a hole barrier layer on the collector layer, the hole barrier layer having a plurality of bandgaps;
   a base layer on the hole barrier layer, the base layer comprising a P-type group III-V semiconductor;
   an emitter layer on the base layer, the emitter layer comprising an N-type group III-V semiconductor;
   an emitter cap layer on the emitter layer, the emitter cap layer comprising an N-type group III-V semiconductor; and
   an ohmic contact layer on the emitter cap layer, the ohmic contact layer comprising an N-type group III-V semiconductor;
   wherein the bandgaps of the hole barrier layer at least comprise a gradually increasing bandgap from the base layer towards the collector layer and a largest bandgap of the hole barrier layer is greater than a bandgap of the base layer.

2. The heterojunction bipolar transistor structure with a bandgap graded hole barrier layer as claimed in claim 1, wherein the hole barrier layer comprises a material selected from the group consisting of: GaAs, GaAsSb, GaAsPSb, InGaAs, InGaAsN, $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$ and $In_rAl_xGa_{1-x-r}As$, wherein 0<x<1.

3. The heterojunction bipolar transistor structure with a bandgap graded hole barrier layer as claimed in claim 1, wherein the hole barrier layer comprises a material selected from the group consisting of: GaAs, GaAsSb, GaAsPSb, InGaAs, InGaAsN, $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$ and $In_rAl_xGa_{1-x-r}As$, wherein the largest value of x is ranged from 0.03 to 0.8.

4. The heterojunction bipolar transistor structure with a bandgap graded hole barrier layer as claimed in claim 1, wherein the hole barrier layer comprises a material selected from the group consisting of: GaAs, GaAsSb, GaAsPSb, InGaAs, InGaAsN, $Al_xGa_{1-x}As$, $Al_xGa_{1-x}As_{1-y}N_y$, $Al_xGa_{1-x}As_{1-z}P_z$, $Al_xGa_{1-x}As_{1-w}Sb_w$ and $In_rAl_xGa_{1-x-r}As$, wherein the largest value of x is ranged from 0.05 to 0.22, and y, z, r, w<0.1.

5. The heterojunction bipolar transistor structure with a bandgap graded hole barrier layer as claimed in claim 1, wherein a thickness of the hole barrier layer is between 1 nm-500 nm.

6. The heterojunction bipolar transistor structure with a bandgap graded hole barrier layer as claimed in claim 1, wherein the collector layer comprises a material selected from the group consisting of: GaAs, InGaP, InGaAsP and AlGaAs; the base layer comprises a P-type material selected from the group consisting of: GaAs, GaAsSb, GaAsPSb, InGaAs, and InGaAsN; the emitter layer comprises a N-type material selected from the group consisting of: AlGaAs, InGaP, InAlGaP and InGaAsP; the emitter cap layer comprises a N-type material selected from the group consisting of: GaAs, AlGaAs, InGaP, and InGaAsP; and the ohmic contact layer comprises a N-type material selected from the group consisting of: GaAs and InGaAs.

7. The heterojunction bipolar transistor structure with a bandgap graded hole barrier layer as claimed in claim 1, further comprising an intermediate composite layer, the intermediate composite layer comprising a semiconductor layer provided between the substrate and the sub-collector layer.

8. The heterojunction bipolar transistor structure with a bandgap graded hole barrier layer as claimed in claim 7, wherein the intermediate composite layer comprises at least a buffer layer, and the buffer layer comprises a group III-V semiconductor or a field effect transistor (FET).

9. The heterojunction bipolar transistor structure with a bandgap graded hole barrier layer as claimed in claim 7, wherein the intermediate composite layer comprises a pseudomorphic high electron mobility transistor (pHEMT), and the pHEMT comprises at least a buffer layer, a first donor layer, a first spacer layer, a channel layer, a second spacer layer, a second donor layer, a Schottky layer, an etch stop layer, and a cap layer for ohmic contact, all formed sequentially on the substrate from bottom up, the buffer layer comprises a group III-V semiconductor; the first donor layer or the second donor layer comprises a N-type material selected from the group consisting of: GaAs, AlGaAs, InAlGaP, InGaP and InGaAsP; the first spacer layer or the second spacer layer comprises a material selected from the group consisting of: GaAs, AlGaAs, InAlGaP, InGaP, and InGaAsP; the channel layer comprises a material selected from the group consisting of: GaAs, InGaAs, AlGaAs, InAlGaP, InGaP, and InGaAsP; the Schottky layer comprises a material selected from the group consisting of: GaAs, AlGaAs, InAlGaP, InGaP, and InGaAsP; the etch stop layer comprises a material selected from the group consisting of: GaAs, AlGaAs, InAlGaP, InGaAsP, InGaP, and AlAs; and the cap layer comprises an N-type group III-V semiconductor.

10. The heterojunction bipolar transistor structure with a bandgap graded hole barrier layer as claimed in claim 1, wherein the bandgap of the hole barrier layer in the gradually increasing bandgap from the base layer towards the collector layer comprises at least one or more segments of linear graded bandgap, nonlinear graded bandgap, step graded bandgap, or a combination thereof.

11. The heterojunction bipolar transistor structure with a bandgap graded hole barrier layer as claimed in claim 1, wherein the bandgaps of the hole barrier layer further comprise a decreasing bandgap after the gradually increasing bandgap from the base layer towards the collector layer, and the bandgaps of the hole barrier layer comprise at least one or more segments of linear graded bandgap, nonlinear graded bandgap, step graded bandgap, or a combination thereof.

12. The heterojunction bipolar transistor structure with a bandgap graded hole barrier layer as claimed in claim 1, wherein the bandgaps of the hole barrier layer further comprise at least a layer with a constant bandgap during and/or after the gradually increasing bandgap from the base layer towards the collector layer, and the bandgaps of the hole barrier layer comprise at least one or more segments of linear graded bandgap, nonlinear graded bandgap, step graded bandgap, or a combination thereof.

13. The heterojunction bipolar transistor structure with a bandgap graded hole barrier layer as claimed in claim 1, wherein the bandgaps of the hole barrier layer further comprise at least a layer with a constant bandgap during and/or after the gradually increasing bandgap from the base layer towards the collector layer, and also comprise a decreasing bandgap after the gradually increasing bandgap of the hole barrier layer from the base layer towards the collector layer and further comprise at least a layer with a constant bandgap during and/or after the decreasing bandgap; and the bandgaps of the hole barrier layer comprise at least one or more segments of linear graded bandgap, nonlinear graded bandgap, step graded bandgap, or a combination thereof.

14. The heterojunction bipolar transistor structure with a bandgap graded hole barrier layer as claimed in claim 1, wherein the bandgaps of the hole barrier layer further comprise a decreasing bandgap after the gradually increasing bandgap from the base layer towards the collector layer and comprise at least a layer with a constant bandgap during and/or after the decreasing bandgap; and the bandgaps of the hole barrier layer comprise at least one or more segments of linear graded bandgap, nonlinear graded bandgap, step graded bandgap, or a combination thereof.

15. The heterojunction bipolar transistor structure with a bandgap graded hole barrier layer as claimed in claim 1, further comprising a spacer layer, the spacer layer comprising a group III-V semiconductor provided between the hole barrier layer and the base layer, and/or between the hole barrier layer and the collector layer.

16. The heterojunction bipolar transistor structure with a bandgap graded hole barrier layer as claimed in claim 15, wherein the spacer layer comprises a material selected from the group consisting of: GaAs, GaAsSb, GaAsPSb, InGaAs, InGaAsN, AlGaAs, AlGaAsSb, AlGaAsP, InAlGaAs, and AlGaAsN; the spacer layer is P-type, undoped, or N-type.

17. The heterojunction bipolar transistor structure with a bandgap graded hole barrier layer as claimed in claim 1, wherein the hole barrier layer is N-type, and a doping concentration of the hole barrier layer is between $1 \times 10^{15}/cm^3$ and $1 \times 10^{19}/cm^3$.

18. The heterojunction bipolar transistor structure with a bandgap graded hole barrier layer as claimed in claim 1, wherein the hole barrier layer further comprises a wide bandgap layer, and the wide bandgap layer provides a valence band discontinuity between the wide bandgap layer and an adjacent epitaxial layer.

19. The heterojunction bipolar transistor structure with a bandgap graded hole barrier layer as claimed in claim 18, wherein the wide bandgap layer comprises a material selected from the group consisting of: AlGaAs, AlGaAsP, AlGaAsN, AlGaAsSb, AlGaAsBi, InGaP, InGaPN, InGaPSb, InGaPBi, InGaAsP, InGaAsPN, InGaAsPSb, InGaAsPBi, InAlGaP, InAlGaPN, InAlGaPSb, and InAlGaPBi.

20. The heterojunction bipolar transistor structure with a bandgap graded hole barrier layer as claimed in claim 18, wherein a thickness of the wide bandgap layer is equal to or less than 50 nm, wherein 0 is excluded.

* * * * *